United States Patent [19]
Dunning et al.

[11] Patent Number: 5,396,128
[45] Date of Patent: Mar. 7, 1995

[54] OUTPUT CIRCUIT FOR INTERFACING INTEGRATED CIRCUITS HAVING DIFFERENT POWER SUPPLY POTENTIALS

[75] Inventors: James E. Dunning; James R. Lundberg; Richard S. Ramus, all of Austin; James G. Gay, Pflugerville, all of Tex.

[73] Assignee: Motorola, Inc., Schaumburg, Ill.

[21] Appl. No.: 120,506

[22] Filed: Sep. 13, 1993

[51] Int. Cl.[6] .......................................... H03K 19/003
[52] U.S. Cl. ...................................... 326/68; 326/57; 326/21; 327/534
[58] Field of Search ............... 307/443, 451, 473, 475, 307/296.2

[56] References Cited

U.S. PATENT DOCUMENTS

| | | | |
|---|---|---|---|
| 4,782,250 | 11/1988 | Adams et al. | 307/473 |
| 4,963,766 | 10/1988 | Lundberg | 307/451 |
| 5,124,585 | 6/1992 | Kim et al. | 307/475 X |
| 5,144,165 | 9/1992 | Dhong et al. | 307/475 X |
| 5,151,619 | 9/1992 | Austin et al. | 307/475 X |
| 5,160,855 | 11/1992 | Dobberpuhl | 307/443 X |
| 5,191,244 | 3/1993 | Runaldue et al. | 307/475 |
| 5,223,751 | 6/1993 | Simmons et al. | 307/475 |
| 5,243,236 | 9/1993 | McDaniel | 307/475 |
| 5,266,849 | 11/1993 | Kitahara et al. | 307/296.2 X |
| 5,276,364 | 1/1994 | Wellheuser | 307/475 |
| 5,300,835 | 4/1994 | Assar et al. | 307/475 |

OTHER PUBLICATIONS

A 200-MHz 64-b Dual-Issue CMOS Microprocessor, Dobberpuhl; IEEE, Nov. 1992, pp. 1555-1567.

*Primary Examiner*—David R. Hudspeth
*Attorney, Agent, or Firm*—Keith E. Witek

[57] ABSTRACT

An output driver circuit has a circuitry portion (70) which is used to generate a Drive-Hi control signal in response to an Output Enable, an optional Precondition signal, and a Data Input signal. A circuit portion (75) ensures that the Drive-Hi control signal is maintained at a voltage which is substantially equal to Vdd when the Output Enable is deactivated. Circuit portion (80) selectively controls the Data Output by driving Vdd onto the Data Output in response to the Drive-Hi control signal being activated. A circuit portion (100) functions to selectively drive the Data Output to a logic zero (ground potential) when a Drive-Lo signal is asserted. Circuit portions (90 and 95) generate the Drive-Lo signal in response to the Output Enable, the optional Precondition signal, and the Data Input signal. In general, the output driver circuit allows an integrated circuit powered at a first voltage to interface to another integrated circuit which is powered at a higher second voltage without loss of performance, without excessive leakage currents, without crossover current, and without increasing gate oxide stresses.

61 Claims, 7 Drawing Sheets

OUTPUT CIRCUIT FOR INTERFACING INTEGRATED CIRCUITS HAVING DIFFERENT POWER SUPPLY POTENTIALS

FIELD OF THE INVENTION

The present invention relates generally to semiconductor circuits, and more particularly, to output buffers for integrated circuits.

BACKGROUND OF THE INVENTION

Output driver circuits are designed into semiconductor integrated circuits in order to allow integrated circuits to communicate with circuitry external to the integrated circuit via integrated circuit pins. In most cases, a group of output and/or input conductors of an integrated circuit are referred to collectively as a bus. A bus is a group of conductive lines that interconnect several integrated circuits. In most cases, many of the several integrated circuits contain driver circuits that selectively influence the voltage potential of one or more conductors within the bus. For example, a data line or data bus may connect several integrated circuits into a system wherein each integrated circuit is either a microprocessor, an analog device, a memory device, or any other known integrated circuit. Each of the integrated circuits may operate from a different power supply voltage potential. For example, one integrated circuit may operate at five volts, another integrated circuit may operate at 3.3 volts, and yet another integrated circuit may operate at two volts.

Furthermore, in order to increase the number of transistors on an integrated circuit, reduce power dissipation, and increase circuit operational speed, circuit and device geometric dimensions are being gradually reduced through time. The reduced devices are less able to withstand internal integrated circuit electric fields, and are vulnerable to damage and reduced performance when high electric fields are present. In addition, gate oxides of transistors are becoming thinner through time. Thin gate oxides are more susceptible to known and understood reliability failure and breakdown problems than thick gate oxides. Also, channel lengths are being reduced over time. Reduced channel lengths result in known and undesirable hot carrier injection (HCI) effects. In order to overcome the problems listed above, integrated circuits are now being designed for use with lower power supply voltages. For example, 3.3 volts is currently replacing five volts in the industry, and voltages lower than 3.3 volts are expected to be widely used in the near future.

The lower power supply voltages solved many of the problems listed above, but resulted in a new problem that must be solved. The new problem is that it is difficult to interface two integrated circuits or two integrated circuit drivers which operate at different supply voltages.

To further understand the new problem, FIG. 1 is illustrated. FIG. 1 illustrates a first conventional push-pull complementary metal oxide semiconductor (CMOS) output driver within a first integrated circuit 10. The first conventional push-pull CMOS output driver is connected to a second conventional push-pull CMOS output driver located within a second integrated circuit 16. The output stage of a standard push-pull output driver has a P-channel pull-up transistor illustrated via transistors 12 and 18. N-channel transistors 14 and 20 respectively function as pull-down transistors for each of the output stages of the push-pull output drivers. Integrated circuit 10 is powered by a Vdd power supply labeled "Vdd3" which indicates a 3.3 volt power supply potential. Integrated circuit 16 is powered by a Vdd voltage source labeled "Vdd5" which indicates a 5.0 volt power supply potential. A ground potential is connected to N-channel transistors 14 and 20 as illustrated in FIG. 1.

Separate "drive-hi" signals are used to gate the P-channel transistors 12 and 18 in order to output a logic high signal across the data line. Circuit 10 will drive logic high signal of 3.3 volts and circuit 16 will drive a logic high signal of 5.0 volts. A logic low signal (i.e., ground potential or zero volts) is output along the data line by gating one of the N-channel transistors via a "drive-lo" signal. Usually, "drive-hi" and "drive-lo" are logically designed so that transistors 12 and 14 and transistors 18 and 20 are never "on" simultaneously. Specifically, no more than one transistor among transistors 12, 14, 18, and 20 are in a conductive state at one time. The situation of different integrated circuits having different power supply voltages is becoming very common in modern system designs and modern board-level designs.

The above-described problem occurs when "Vdd5" is significantly greater than "Vdd3" as illustrated in FIG. 1. Assume the alternate driver (integrated circuit 16) is driving a logic high value onto the data line. Therefore transistor 18 is on and transistor 20 is off. Five volts is therefore placed onto the data line. The output stage (i.e., transistors 12 and 14) of integrated circuit 10 is receiving the information from circuit 16 and therefore transistors 12 and 14 are off. In this state, the buffer is said to be tri-stated. When tri-stated, the voltage on the data line will pass to the input circuit as illustrated. The voltage difference between the gate of transistor 12 and the data line is (Vdd5−Vdd3) or roughly 1.7 volts. The drain-to-source voltage magnitude on transistor 12 is also (Vdd5−Vdd3) or roughly 1.7 volts. Since the magnitude of the voltage differential (Vdd5−Vdd3) is greater than the magnitude of the threshold voltage of most MOS transistors (|Vt| is usually between 0.5 and 1.5 volts, roughly), transistor 12 will turn on or conduct a significant amount of current.

Because transistor 12 is on, a large current leakage path is formed from the data line to Vdd3 through transistor 12 when circuit 16 sends a logic high value on the data line. Also, a large current may flow from the data line through the n-well to the supply Vdd3 due to the fact that the drain junction diode of transistor 12 is forward biased. Accordingly, high power dissipation, increased integrated circuit heating, and degraded reliability results. Catastrophic circuit failure is now more likely to occur in circuit 10. Therefore, there is a "compatability problem" when interfacing integrated circuits having different voltage supply potentials.

To improve upon the "compatibility problem", several circuits have been implemented in the art. Each of these implementations is discussed below, and each of the circuits discussed below has disadvantages which are also identified.

FIG. 2 illustrates a circuit which is taught by U.S. Pat. No. 4,782,250, issued Nov. 1, 1988, by Adams et al. FIG. 2 illustrates several P-channel transistors 30, 32, 36, and 38 which are formed in a floating n-well (node 40). The n-well is not connected to a particular voltage, but is instead electrically floating. When the voltage at the output enable is zero volts, transistor 28 is off and transistor 36 is on. Therefore, the voltages at "B" and "C" are equalized. The voltage at node "A" is 3.3 volts so transistor 30 is off. Also, transistor 22 is off. Therefore, the driver is in a high impedance state or tri-stated. If an external driver makes the "data output" node equal to five volts, then the transistor 30 turns on raising the voltages at nodes "B" and "C" to five volts. Also, current flows from the data output to the n-well 40 through transistors 30, 32, and 36. The n-well voltage rises to five volts minus a diode threshold voltage drop (roughly 0.7 volts). No current flows from the n-well to the Vdd supply. Transistor 30 is on, but transistor 32 is off (i.e., the circuit is in a tri-state mode). In FIG. 2, there is no high current leakage from the data output to the Vdd terminal as shown/discussed in FIG. 1.

However, the driver illustrated in FIG. 2 has several further disadvantages. One problem is that the driver uses two P-channel pull-up transistors 30 and 32 in series with the Vdd supply. Therefore, each of the transistors 30 and 32 must be twice the size of a single pull-up transistor in order to provide the same current performance as a single pull-up transistor. The increased transistor size results in a 4× loss of substrate surface area, which is extremely undesirable since driver transistors are usually large to begin with. Larger transistors also have larger power consumption and larger capacitance than smaller transistors. A second problem is that the circuit of FIG. 2 is susceptible to electrostatic discharge (ESD) damage because transistor 38 has a gate connected directly to the data output node. As gate oxides become thinner, the ESD damage problem becomes enhanced.

A third problem is that the driver of FIG. 2 has excessively high voltages across gate oxides of certain transistors (transistors 30, 32, and 36 in particular). The high voltages across gate oxides occur whenever the n-well acquires high voltages from the data output and retains a high voltage for a long period of time while the Output Enable is at zero volts. Oxide breakdown or oxide leakage may be enhanced by the high voltages. A fourth problem is that transistor 32 is not actively deasserted (i.e., node C is not actively driven to 3.3 volts or 5 volts to turn the transistor off). Furthermore, Node C must be driven from zero volts to a high voltage (3.3 volts to 5.0 volts) through the transistors 30 and 36 which is a slow process. When the data output is driven above 3.3 volts, a high transient current flows from the data output to the supply Vdd through the transistors 30 and 32. Higher power dissipation, increased circuit heating, and excessive loading results due to the transient current.

FIG. 3 illustrates a circuit which is taught by U.S. Pat. No. 4,963,766, issued Oct. 16, 1990, by Lundberg. In FIG. 3, a supply voltage Vdd3 (nominally 3.3 volts) is applied to the output driver circuit. The n-well of the P-channel transistors 50, 51, and 52 is biased to the voltage Vdd5 (nominally 5 volts) which is the supply voltage of an external driver. A gate of transistor 53 is also biased to Vdd5. Because the gate of transistor 53 is biased to Vdd5, the body effect of transistor 53 does not inhibit the drive-hi signal voltage from fully deasserting to 3.3 volts. Therefore, the pull-up transistor 52 turns off. If an external driver then drives the data output node to five volts, transistor 51 turns on raising the voltage at the drive-hi node to roughly five volts. A node 55 maintains a voltage slightly greater than 3.3 volts because of the body effect of transistor 53. Because of the above identified voltage configuration, transistor 52 is off and the p-n junction from the data output to the n-well is not forward biased. Therefore, no high-current leakage results between the data output and Vdd3 as discussed in reference to FIG. 2.

However, the driver of FIG. 3 has several disadvantages. The first problem is that the driver requires a dedicated pin on the integrated circuit to provide the voltage Vdd5 in addition to the voltage Vdd3. A second problem is that the circuit in FIG. 3 allows excessively high voltages across the gate oxides of various transistors during operation. For example, when Drive-Hi is equal to zero volts, the transistor 52 has a large potential difference across the gate oxide of transistor 52. Oxide reliability is degraded, and the likelihood of oxide breakdown is increased. A third problem is that the driver has a low-current leakage path from the data output to the supply Vdd3 when the driver is in the high impedance state and an external driver drives the output to five volts. This low-current leakage path is through the transistors 50, 51, and 53. Power consumption and input-high current loading ($I_{ih}$ loading) are both increased, which is disadvantageous.

A third circuit that partially solves the compatibility problem has been documented by Dobberpuhl, et al., in the IEEE Journal of Solid State Circuits, Vol. 27, No. 11, November 1992, pp. 1555-1567 and is shown in FIG. 4. In this circuit, the bulk node of the p-channel transistors, 64, 65, 66, 67, 68, 69, and 60, is a floating n-well. The n-well is preferably formed as at least one diffusion region/well within a semiconductor substrate. There is only one pull-up transistor labeled transistor 66. Usually, the n-well voltage is 3.3 volts. After the drive-high signal is deasserted and the circuit is put into the high impedance state, the voltage on node 3 is 0 volts, and the voltage on node 5 is 3.3 volts. The inverter in FIG. 4 drives node 4 to 3.3 volts. Due to the fact that the transistor 65 is off, the voltage on node 6 rises only to around (Vdd3 − |Vth, body|). In other words, |Vth, body| is greater than |Vth| and |Vtp| = |Vtn| and therefore transistor 66 is not fully off. Therefore, the driver is not truly in the high impedance state. This is disadvantageous. If an external alternate driver subsequently drives node 8 to a voltage greater than 3.3 volts (i.e., drives the output node to 5 volts), then transistor 69 turns on, raising the voltage of the n-well to 5 volts. Also, transistor 64 turns on, raising the voltage on node 6 to 5 volts. Accordingly, the voltage on nodes 5 and 7 will also rise to 5 volts. Because of this voltage configuration, transistor 66 is off, and the p-n diode from the output to the n-well is not forward biased. Therefore, there is no high-current leakage as discussed above for other output buffer circuits. The reduction in leakage current is advantageous.

However, the driver taught by Dobberpuhl et al. has several disadvantages. One problem is that the circuit is susceptible to ESD damage because transistors 65 and 67 have their respective gate nodes connected to the output node 8. Although the gate nodes are somewhat protected by resistors R1 and R2, an ESD event at the output node could rupture the gate oxide of the transistors 65 and/or 67, especially if the transistors are fabricated using a thin-oxide process (i.e., roughly 70-150 Angstroms). Also, transistor 61 is off and transistor 66 is on the boundary between its off state and its conducting state, which is disadvantageous.

A second problem is that the driver of FIG. 4 can suffer from high crossover current in some applications when driving the output to zero volts. To illustrate this crossover current, the voltage on node 5 is initially 3.3 volts or higher. As has been discussed above, when the inverter drives the voltage on node 4 to 3.3 volts to turn off the pull-up transistor, transistor 65 is off, and the voltage on node 6 rises in voltage to (Vdd3−|Vth, body| of transistor 63) because of the body effect of transistor 63. Due to the fact that the threshold voltage of 63 is proportional to the square root of the source to bulk voltage and the source node of 63 is connected to the gate of the pull-up transistor, the threshold voltage increases as the voltage on the gate of the pull-up transistor increases, limiting the voltage on node 6. Electrical coupling from the overlap capacitance of the pull-up transistor 66 further decreases the voltage on node 6. The pull-up transistor 66 is not fully off. The voltage on node 2 rises to 3.3 volts, turning transistor 61 on. Thus, for a time, both the pull-up transistor 66 and pull-down transistors 61 and 62 conduct a significant amount of crossover current from the supply voltage to ground. The crossover current increases chip heating, increases power dissipation, increases the output transition time, and decreases noise immunity.

A third problem is that the driver of FIG. 4 suffers from excessively high voltages across the gate oxides of certain transistors in the circuit. If the driver is in the high impedance state, and an external alternate driver drives the output node to five volts, the n-well voltage rises to five volts, as described above. The n-well voltage can be even higher under other circumstances (e.g., transmission line effects, noise, etc.). If the next operation of the circuit causes the driver to drive the output node to 3.3 volts, the voltage on node 3 (drive-high) will rise to 3.3 volts. The inverter drives the voltage on node 4 to 0 volts. The voltage on node 6 discharges to zero volts through pass transistor 63. The n-well can retain its voltage of 5 volts, or more, for a relatively long time, resulting in an excessively high transient voltage across the gate oxide of transistor 66 since the transistors 64 and 69 are both in the n-well discharge path. This voltage situation usually degrades the oxide reliability of 66 and can lead to oxide breakdown. If instead of driving the output node to 3.3 volts, the driver drives the output node to zero volts, the voltage on node 2 rises to 3.3 volts. As node 5 discharges to zero volts, the discharging of node 5 may result in an excessively high transient voltage across the gate oxide of transistors 65 and 67 and can degrade the reliability of these transistors.

Therefore, a need exists for an output buffer circuit which overcomes the disadvantages discussed above.

SUMMARY OF THE INVENTION

The previously mentioned disadvantages are overcome and other advantages achieved with the present invention. In one form, the present invention comprises a first integrated circuit having a first output driver which is to interface with a second output driver located within a second integrated circuit. The first output driver being powered by a first voltage and the second output driver being powered by a second voltage. The first voltage is less than the second voltage. The first output driver has a power supply voltage conductor for providing the first voltage, a data input conductor for providing a data input signal, an output enable conductor for providing an output enable signal, and a well conductor used to bias at least one n-well of at least one transistor within the first output driver. The first output driver has circuitry for generating a control signal. The circuitry for generating a control signal contains at least one transistor and has a first terminal coupled to the power supply voltage conductor, a second terminal coupled to the output enable conductor, a third terminal coupled to the well conductor, and a fourth terminal coupled to the data input conductor. The circuitry for generating drives a control signal conductor to the first voltage response to the deactivation of the control signal. The circuitry for generating discharges the control signal and a gate voltage on the at least one transistor at a substantially equal rate to reduce gate oxide stress. The first output driver has circuitry for providing an output logic value onto an output conductor. The circuitry for providing has a first terminal coupled to the output conductor, a second terminal for receiving the first voltage through at least one pull-up transistor, a third terminal coupled to the well conductor, and a fourth terminal coupled to the control signal conductor. The circuitry for providing discharges a voltage on the well conductor from the second voltage in a manner which tracks the voltage of the control signal conductor to reduce electric field stress across a gate oxide of the pull-up transistor.

In another form, the invention comprises an output driver. The output driver having a p-channel pull-up transistor. The p-channel pull-up transistor has a first electrode connected to a power supply voltage, a second electrode coupled to a data output line, an n-well conductor which allows the voltage of a channel region of the pull-up transistor to be altered, and a gate electrode for receiving a first control signal. An n-channel pull-down transistor has a first electrode connected to a ground potential, a second electrode coupled to the data output line, and a gate electrode for receiving a second control signal. The output driver also has a single p-channel transistor with a first electrode coupled to the n-well conductor, a second electrode coupled to the first control signal, a channel region coupled to the n-well conductor, and a gate electrode for receiving the power supply voltage. The single p-channel transistor selectively coupling the n-well conductor to the first control signal.

In yet another form, the invention comprises an output buffer circuit having an output, an output enable, a data input, a plurality of p-channel transistors, and circuitry for selectively providing a logic low value to the output. The plurality of p-channel transistors being coupled together to selectively provide a logic high value to the output in response to the data input and the output enable. The plurality of p-channel transistors also being coupled to a supply voltage. The plurality of p-channel transistors being capable of receiving a voltage greater than the supply voltage from the output without adverse leakage current resulting from the output to the supply voltage. The plurality of p-channel transistors each have a gate-to-channel voltage which does not exceed 4.1 volts.

The present invention will be more clearly understood from the detailed description below in conjunction with the accompanying drawings.

DESCRIPTION OF A PREFERRED EMBODIMENT

Figure 5:
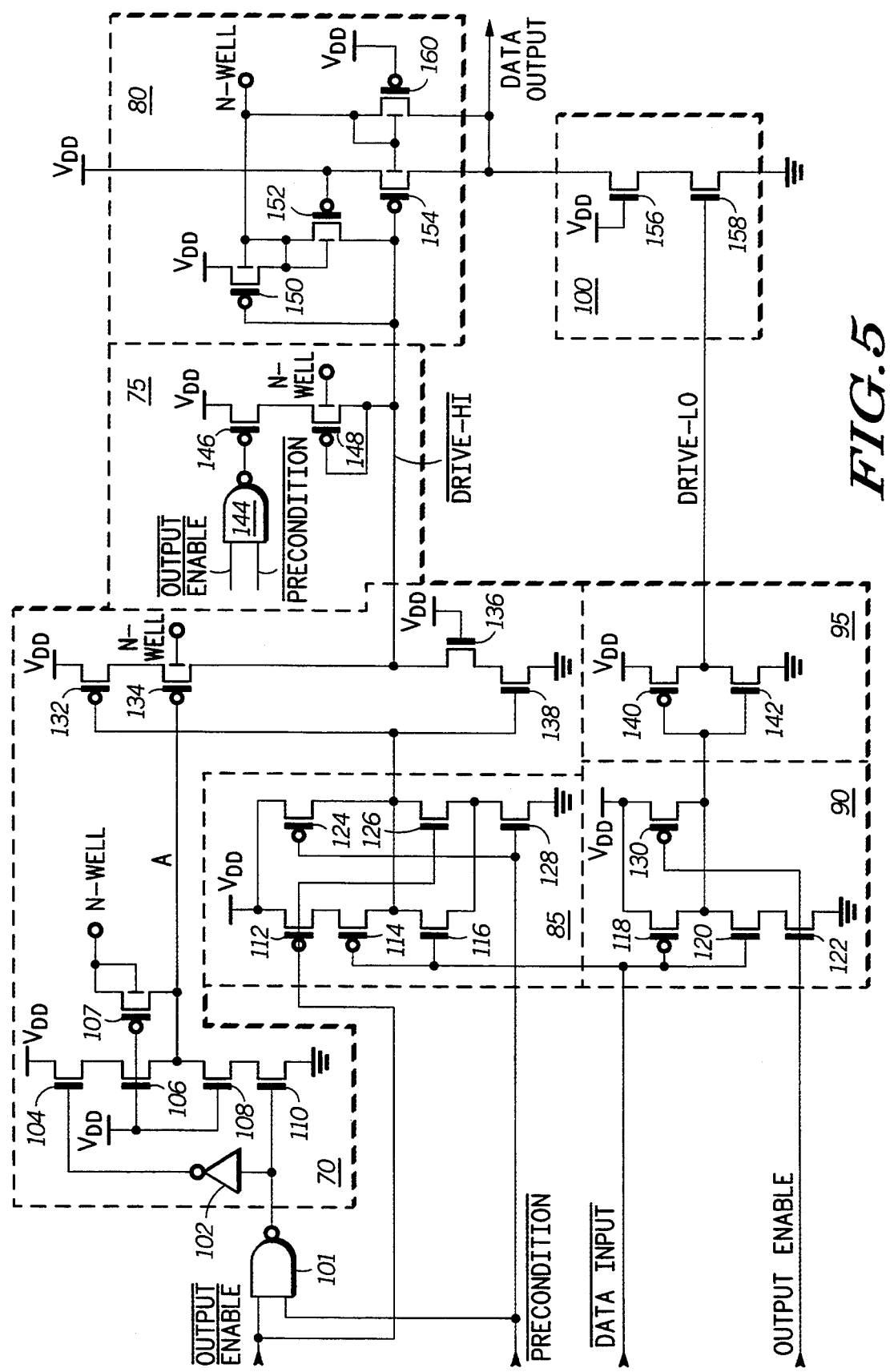
FIG. 5 illustrates in a circuit schematic an output buffer/driver circuit in accordance with the present invention.

Illustrated in FIG. 5 is an output buffer circuit or an input/output buffer circuit in accordance with the present invention. FIG. 5 illustrates an Output Enable input signal, an optional Precondition input signal, a Data Input signal, an Output Enable input signal, and a Data Output terminal. A circuit portion 70 has an input provided by a NAND gate 101. The NAND gate 101 has a first input for receiving the Output Enable input signal, a second input for receiving the optional Precondition input signal, and an output. Due to the fact that the Precondition input signal is optional, the NAND gate 101 is optional. If the NAND gate 101 and the Precondition input signal are not used, then the Output Enable signal is routed directly into circuit portion 70 as an input.

A circuit portion 85 is illustrated in FIG. 5. A p-channel transistor 112 has a first electrode for receiving the power supply voltage Vdd, a second electrode, and a gate electrode for receiving the Output Enable input signal. A p-channel transistor 114 has a first electrode connected to the second electrode of the transistor 112, a second electrode, and a gate electrode for receiving the Data Input signal. An n-channel transistor 116 has a first electrode connected to the second electrode of the transistor 114, a second electrode, and a gate electrode for receiving the Data Input signal. A p-channel transistor 124 has a first electrode for receiving the power supply voltage Vdd, a second electrode, and a gate electrode for receiving the optional Precondition input signal. An n-channel transistor 126 has a first electrode connected to the second electrode of transistor 124, a second electrode connected to the second electrode of the transistor 116, and a gate electrode for receiving the Output Enable input signal. An n-channel transistor 128 has a first electrode connected to the second electrode of the transistor 126, a second electrode connected to ground, and a gate electrode for receiving the optional Precondition input signal. The second electrode of transistor 114 is connected to the second electrode of the transistor 124. Circuit portion 85 performs a complex logic operation of the signals Precondition, Data Input, and Output Enable.

If the Precondition signal is not used in the circuit of FIG. 5 then the circuit portion 85 functions as a NOR gate which performs a NOR operation on the signals Output Enable and Data Input. In general, the Precondition signal is used to selectively drive the Data Output signal in FIG. 5 to a voltage lower than the externally applied Data Output voltage of 5.0 volts. Usually the Precondition signal is a control signal which is used to drive the Data Output control signal in FIG. 5 to a voltage of roughly 3.3 volts (Vdd of FIG. 5).

In general, the Precondition signal is also used to keep a Drive-Hi control signal to the Vdd value when the drive of FIG. 5 is in a tri-state mode. The Precondition signal is generated by a bus control unit (not illustrated) within the integrated circuit which contains the driver of FIG. 5. In one form, the Precondition signal is generated a predetermined time limit before the assertion of the Output Enable signal. The Precondition signal is preferably asserted roughly one clock cycle before the assertion of the Output Enable signal. This assertion order is performed so that the Precondition signal into NAND gate 101 can force the voltage on the Data Output to 3.3 volts prior to the driver of FIG. 5 gaining access to the bus only if the Data Output is currently at a logic high value. For example, assume that the Data Output is at 5 volts. The driver of FIG. 5 is granted ownership of the bus. Precondition is asserted before the Output Enable signal in order to drive the 5 volt signal on Data Output from 5 volts to 3.3 volts. Pre-driving the Data Output from 5 volts to 3.3 volts before the Output Enable signal is asserted allows a zero to be driven by the circuit of FIG. 5 in a fast manner. Driving a 3.3 volt signal to a zero volts signal occurs in the circuit of FIG. 5 roughly two nanoseconds faster than driving a 5 volts signal to zero volts depending upon loading effects of the Data Output. Therefore, the Precondition signal allows for improved output driver performance.

Within circuit portion 70 is an inverter 102. Inverter 102 has an output and an input connected to one of either the output of the optional NAND gate 101 or the Output Enable signal as discussed above. An n-channel transistor 104 has a first electrode for receiving a power supply voltage labeled "Vdd", a second electrode, and a gate electrode for receiving the output of the inverter 102. An n-channel transistor 106 has a first electrode connected to the second electrode of the transistor 104, a second electrode, and a gate electrode connected to the supply voltage Vdd. An n-channel transistor 108 has a first electrode connected to the second electrode of the transistor 106, a second electrode, and a gate electrode connected to the supply voltage Vdd. An n-channel transistor 110 has a first electrode connected to the second electrode of transistor 108, a second electrode connected to a ground potential, and a gate electrode connected to one of either the output of the optional NAND gate 101 or the Output Enable signal as discussed above. A p-channel transistor 107 has a first electrode coupled to an n-well conductor (i.e., the n-well in which the transistor 107 is formed, a substrate contact, a n-well contact, or a channel terminal connected to the n-well conductor), a second electrode connected to the second electrode of transistor 106, and a gate electrode for receiving the power supply voltage Vdd.

A p-channel transistor 132 has a first electrode for receiving the power supply voltage Vdd, a second electrode, and a gate electrode connected to the second electrode of the transistor 124. A p-channel transistor 134 has a first electrode connected to the second electrode of the transistor 132, a channel terminal connected to the n-well conductor for biasing the channel region of transistor 134, a second electrode, and a gate electrode connected to the second electrode of the transistor 107. An n-channel transistor 136 has a first electrode connected to the second electrode of the transistor 134, a second electrode, and a gate electrode for receiving the power supply voltage Vdd. An n-channel transistor 138 has a first electrode connected to the second electrode of the transistor 136, a second electrode for receiving a ground potential, and a gate electrode connected to the gate electrode of transistor 132.

A circuit portion 75 has an optional NAND gate 144 having a first input for receiving the Output Enable input signal, a second input for receiving the optional Precondition input signal, and an output. If the Precondition input signal is not used, then the NAND gate 144 is replaced by a direct connection to the Output Enable input signal. A p-channel transistor 146 has a first electrode connected to the Vdd voltage, a second electrode, and a gate electrode for receiving one of either the Output Enable or the output of the NAND gate 144 as discussed above. A p-channel transistor 148 has a first electrode connected to the second electrode of the transistor 146, a channel terminal or n-well connection coupled to the n-well conductor, a second electrode coupled to the first electrode of the transistor 136, and a gate electrode coupled to the first electrode of the transistor 136.

A circuit portion 80 has a p-channel transistor 150 having a first electrode for receiving the voltage Vdd, an n-well connection coupled to the n-well conductor, a second electrode, and a gate electrode coupled to the first electrode of the transistor 136. A p-channel transistor 152 has a first electrode coupled to the n-well conductor, an n-well connection coupled to the n-well conductor, a second electrode coupled to the first electrode of the transistor 136, and a gate electrode for receiving the voltage Vdd. A p-channel transistor 154 has a first electrode for receiving the voltage Vdd, an n-well connection coupled to the n-well conductor, a second electrode coupled to the Data Output terminal, and a gate electrode coupled to the first electrode of the transistor 136. A p-channel transistor 160 has a first electrode coupled to the n-well conductor, an n-well connection coupled to the n-well conductor, a second electrode coupled to the Data Output terminal, and a gate electrode for receiving the voltage Vdd. The transistors 150, 152, 154, and 160 are preferably formed within the same n-well diffusion area within a substrate although separate n-wells may be used and interconnected as illustrated in FIG. 5 via a conductive layer overlying the substrate. Preferably, the transistors 107, 134, 148, and the transistors of circuit portion 80 are all formed in one single n-well diffusion region.

Together, circuit portions 70, 75, and 80 provide circuitry for driving the data output to a logic high value. Vdd is preferably 3.3 volts although any voltage may be used as a voltage supply potential. Ground is usually representative of zero volts but may be any voltage. The power supply voltages may be provided by one source or may each be an independent isolated power supply connection. The ground terminals may be one signal ground connection or may be two or more independent/isolated ground connections. In addition, the conductor used to connect the transistors 134, 136, 148, 150, 152, and 154 is referred to as a Drive-Hi control signal.

A circuit portion 90 has a p-channel transistor 118 with a first electrode for receiving the supply voltage Vdd, a second electrode, and a gate electrode connected to the Data Input signal. An n-channel transistor 120 has a first electrode connected to the second electrode of the transistor 118, a second electrode, and a gate electrode connected to the Data Input signal. An n-channel transistor 122 has a first electrode connected to the second electrode of the transistor 120, a second electrode for receiving a ground potential, and a gate electrode for receiving the Output Enable signal. A p-channel transistor 130 has a first electrode for receiving the power supply voltage Vdd, a second electrode coupled to the second electrode of the transistor 118, and a gate electrode connected to the Output Enable. In general, the transistors 118, 120, 122, and 130 perform a NAND function on the signals Data Input and Output Enable.

A circuit portion 95 has a p-channel transistor with a first electrode for receiving the voltage Vdd, a second electrode, and a gate electrode coupled to the second electrode of the transistor 130. A n-channel transistor 142 has a first electrode connected to the second electrode of the transistor 140, a second electrode for receiving a ground signal, and a gate electrode coupled to the second electrode of the transistor 130. In general, the circuit portion 95 functions as an inverter and generates a Drive-Lo control signal.

A circuit portion 100 has an n-channel transistor 156 with a first electrode connected to the Data Output, a second electrode, and a gate electrode for receiving the voltage Vdd. An n-channel transistor 158 has a first electrode connected to the second electrode of the transistor 156, a second electrode connected to ground, and a gate electrode for receiving the Drive-Lo signal.

The circuit portions 90, 95, and 100 are collectively used to provide a logic zero through the Data Output. Therefore, circuit portions 90, 95, and 100 provide a pull-down function in FIG. 5.

FIG. 5 illustrates an inverting implementation of an output buffer in accordance with the present invention. For the purposes of discussion, the supply voltage, Vdd, is assumed to be 3.3 V, and the Data Output node may be connected to a data line conductor which, in turn, may be connected to an external alternate driver whose supply voltage is 5 volts. Although the example in this discussion is of a 3.3 V driver interfaced to a 5 V driver via a data line, it should be readily apparent that the same invention is applicable to other voltage levels and other situations in which a first driver is interfaced to another external driver whose supply voltage is higher than that of the first driver (for example, when the supply voltage of the driver in FIG. 5 is 2.5 V, and the supply voltage of the said external driver is 3.3 volts, etc.).

The operation of the driver of FIG. 5 is described below. When the driver is performing standard functions (i.e., interfacing 3.3 volts to 3.3 volts, or five volts to five volts), the driver operates in a manner similar to known buffer circuits. The following discussion describes how the driver operates, in a novel manner, when performing functions unique to interfacing a 3.3 volt output buffer with 5.0 volt external drivers (or circuits with a similar supply voltage difference). The following discussion presupposes that the driver is initially in the high impedance state. High impedance means that the Drive-Hi signal is 3.3 volts and the Drive-Lo signal is 0 volts.

As an external driver (not illustrated) drives the output node from, for example, 3.3 volts to 5.0 volts, transistor 160 turns on when the output node voltage (i.e., Data Output) rises above (Vdd +|Vtp|) wherein |Vtp| is the magnitude of the threshold voltage of the p-channel transistor 160. Charge flows from the Data Output node to the n-well node, equalizing the voltage on these two nodes. When the n-well voltage rises above (Vdd+|Vtp|), transistors 152 and 107 turn on. Charge flows from the n-well to the Drive-Hi control signal node and to a node A in FIG. 5, equalizing the voltage on these nodes. As the Data Output node voltage is further driven up to 5 volts, the voltages on the Data Output node, the n-well, the Drive-Hi control signal node, and node A remain equalized. This voltage configuration ensures that transistors 134 and 154 are off. Therefore, transistors 134 and 154 do not conduct current from the output node to the Vdd supply. Also, transistor 150 is off. Therefore, there is no high-current leakage path from the n-well to the Vdd supply. Thus, the driver solves the compatibility problem discussed herein.

As an external driver (not illustrated) drives the output node back down from 5 volts to zero volts, charge begins to flow from the n-well through transistor 160 to the Data Output node. Accordingly, the n-well voltage begins to drop. Charge begins to flow from the Drive-Hi control signal node and node A in FIG. 5 through transistors 152 and 107, respectively, to the n-well. Accordingly, the voltages on the Drive-Hi control signal node and node A begin to drop. As the Data Output node voltage is further driven down toward zero volts (i.e., ground), the voltages on the Data Output node, the n-well, the Drive-Hi control signal node, and node A remain equalized until the voltage on these nodes is around 3.9 volts (Vdd+|Vtp|). At this point in time, transistors 160, 152, and 107 turn off. The voltages on the Drive-Hi control signal node, node A, and the n-well settle to a final value of roughly 3.9 volts, while the Data Output node voltage is driven down to zero volts.

When the external driver (not illustrated in FIG. 5 but coupled externally to the Data Output) has charged the output node to 5 volts and the next operation of the driver is to drive the output to 3.3 volts, the output stage transistors prevent the gate oxide voltages from reaching excessively high levels (i.e., damaging electric fields are kept to a minimum). Initially, the voltage on the Drive-Hi control signal node, node A, and the n-well is 5 volts. In this transition, the Data Input (complement of Data Input) signal voltage is 3.3 volts, and the Output Enable signal voltage rises from zero volts to 3.3 volts. Transistor 138 turns on, discharging the Drive-Hi control signal node. Transistor 152 is on, ensuring that the n-well discharges as the Drive-Hi control signal node discharges. Transistor 160 turns on and begins to discharge the Data Output node, but the Data Output voltage remains roughly 5 volts because of the Data Output node's large capacitance. When the voltage on the Drive-Hi control signal node falls to around 2.7 V (VDD−|Vtp|), transistor 150 turns on to clamp the n-well voltage to 3.3 volts, and the pull-up transistor 154 turns on to discharge the output voltage from 5 volts to 3.3 volts. When the Output Enable signal voltage rises from zero volts to 3.3 volts, transistor 110 also turns on, discharging node A. Node A discharges at a rate which is slower than or comparable to a discharge rate of the Drive-Hi control signal node. Thus, the driver keeps excessively high gate oxide voltages from forming during this transition, providing increased reliability and reduced oxide breakdown over known output/input buffers.

Figure 6:
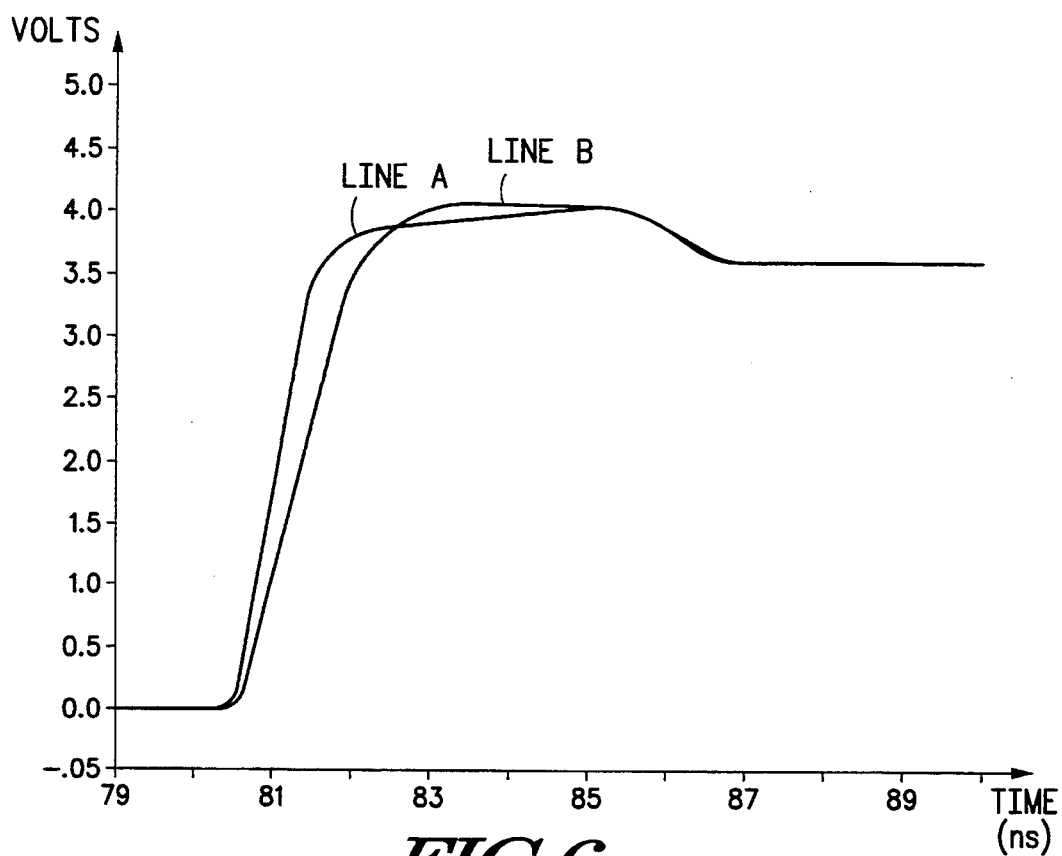
FIG. 6 illustrates in an X-Y graph a plot of simulated results of the behavior of the driver of FIG. 5 as the driver drives the Data Output to the supply voltage Vdd after an external driver has charged the output node to 5.5 V.

FIG. 6 illustrates, via an X-Y graph, a plot of simulation results of the behavior of the driver of FIG. 5 as the driver charges the Data Output to the supply voltage Vdd after the external driver (not illustrated in FIG. 5) has charged the output node to 5.5 V. For the simulation, the supply voltage, Vdd, is 3.6 V, and the supply voltage of the external driver is 5.5 V. Both the process parameters and the parasitic parameters provided herein are for worst-case-speed in a 0.5 micron process, and the simulation temperature is 135° C. The simulated set of conditions is a worst-case scenario for generating excessively high voltages in the circuit during data transitions. For the simulation, the output node is attached to a transmission line whose characteristic impedance is 25 Ohms and whose one-way delay time is 2.5 nanosececonds. The initial conditions for the simulation are that the voltage on the Data Output node, the n-well, the Drive-Hi control signal node, and node A is 5.5 volts and that the Data Input (i.e., the inversion of the Data Input) signal voltage is 3.6 volts. The transition occurs at 80 nanoseconds the simulation (see FIG. 6). At the 80 nanoseconds point, the Output enable signal voltage rises linearly from zero volts to 3.6 volts in roughly 1 nanosecond.

Line A illustrates the voltage difference between the n-well and the Drive-Hi control signal node. Line A is (Drive-Hi potential−n-well potential). This voltage difference is the voltage across the gate oxide of the pull-up transistor 154. During the transition illustrated in FIG. 6, the voltage difference attains a maximum value of approximately 4.0 volts before settling to a final value of roughly 3.6 volts. Line B in the plot shows the voltage difference between the n-well and node A (i.e., {node A potential−n-well potential}). This voltage difference is the voltage across the gate oxide of transistor 134. During the transition in FIG. 6, this voltage difference also attains a maximum value of around 4.0 volts before settling to a final value of roughly 3.6 volts. The voltage levels in these results are well below the breakdown voltage of gate oxide (even a thin gate oxide) and are below the threshold voltage of reliability degradation. These results demonstrate that the driver prevents excessively high voltages from forming in the circuit, which is a characteristic that makes the driver highly reliable.

Figure 4:
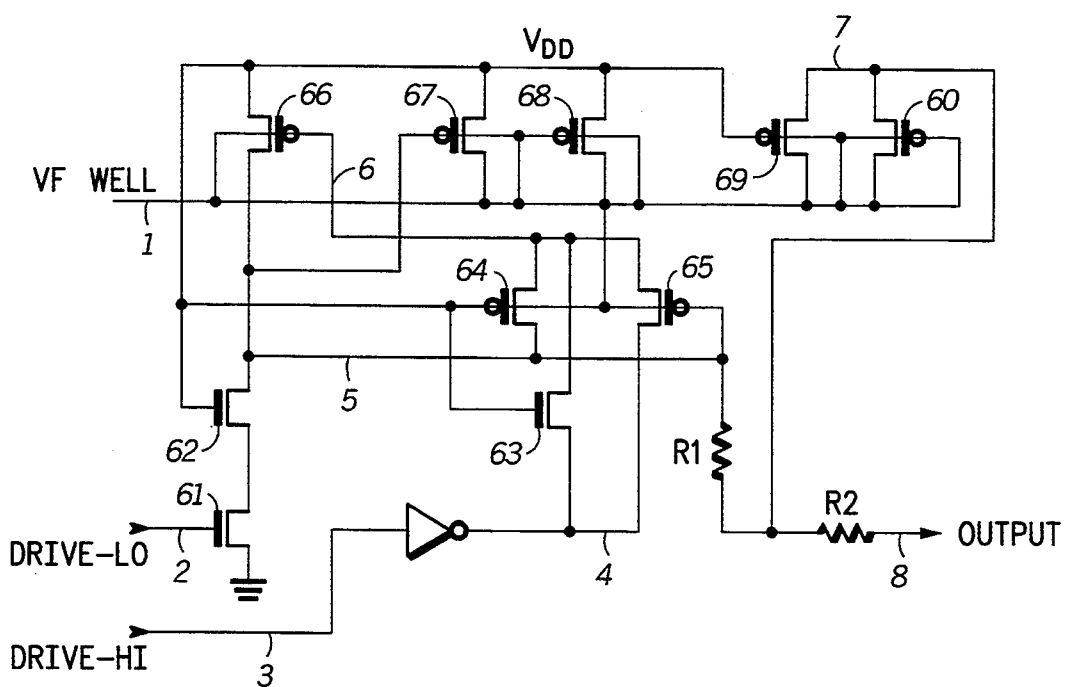
FIG. 4 illustrates in a circuit schematic yet another known output buffer circuit.
Figure 7:
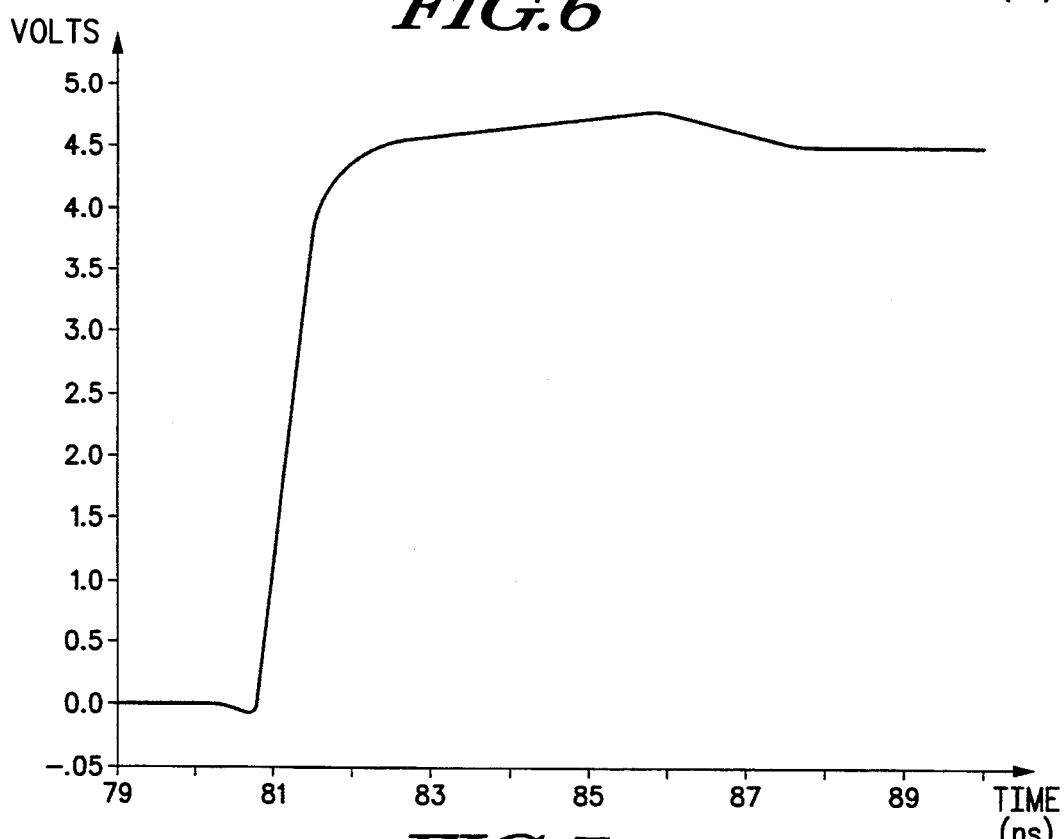
FIG. 7 illustrates in an X-Y graph a plot of results for the conventional driver illustrated in FIG. 4 using the same simulation criterion as in FIG. 6.

For comparison, FIG. 7 illustrates a plot of results for the same simulation of the conventional driver illustrated in FIG. 4 sized similarly to the driver illustrated in FIG. 5. The solid line in the plot shows the voltage difference across the gate oxide of the p-channel pull-up transistor 66 (i.e., {node 6 potential−vfwell}). The voltage attains a maximum of 4.7 volts. The driver illustrated in FIG. 5 places a maximum voltage stress on the pull-up transistor that is roughly equal to 0.7 volts less than that of the driver in FIG. 4. This reduced voltage gives the driver of FIG. 5 increased reliability over that of the driver illustrated via FIG. 4.

The driver of FIG. 5 has several advantages over the drivers of FIGS. 1-4 and solves the disadvantages discussed with regard to FIGS. 1-4. For example, the driver of FIG. 5 is greatly improved over the simple and inadequate driver of FIG. 1. In addition, the driver avoids the problems discussed in reference to the driver of FIG. 2. The driver of FIG. 5 uses only one transistor in the pull-up path, avoiding an increase in silicon substrate surface area, avoiding increased power, and improving upon other known problems associated with increased power and increased surface area. The driver of FIG. 5 has no transistor whose gate is connected directly to the Data Output node, thereby avoiding the associated electrostatic discharge (ESD) robustness problem of the driver of FIG. 2. The driver has provisions for dealing with the situations where excessively high gate oxide voltages occur in various transistors of FIG. 2, thereby avoiding associated reliability problems.

Figure 1:
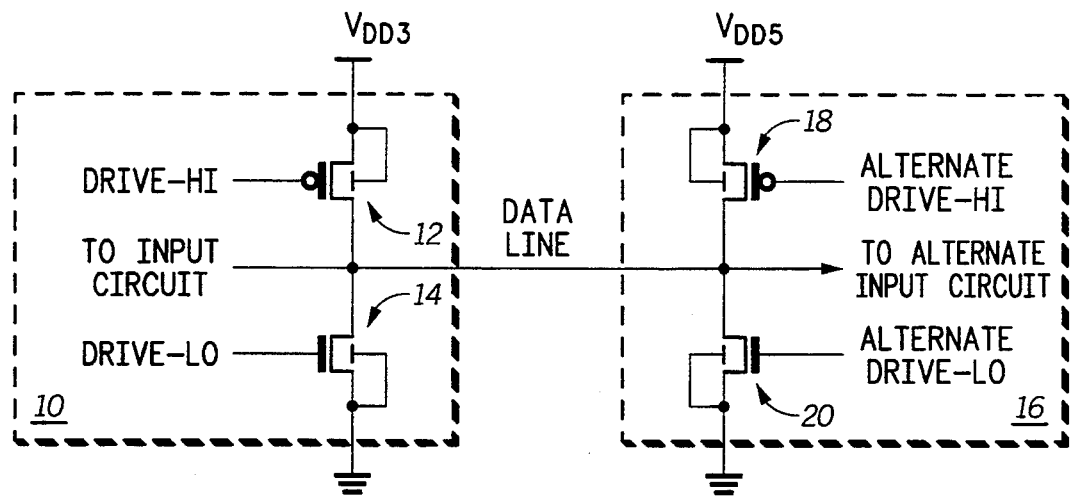
FIG. 1 illustrates in a circuit schematic a conventional first output buffer connected to a conventional second output buffer.
Figure 2:
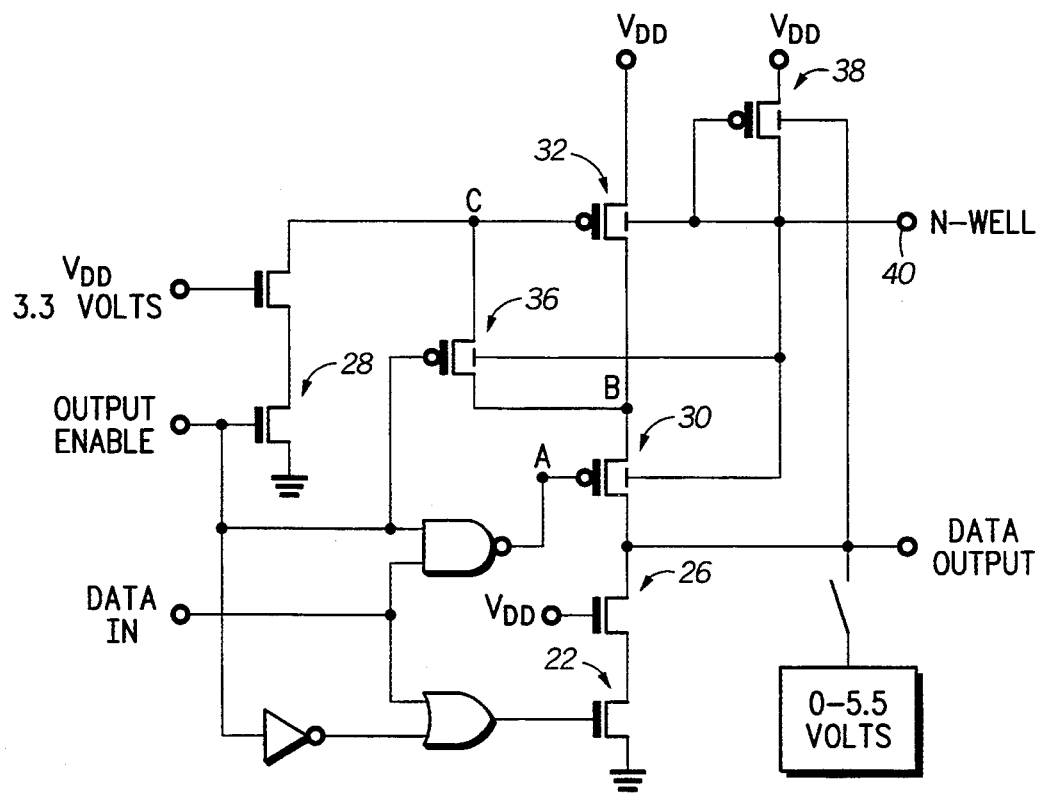
FIG. 2 illustrates in a circuit schematic a known output buffer circuit.
Figure 3:
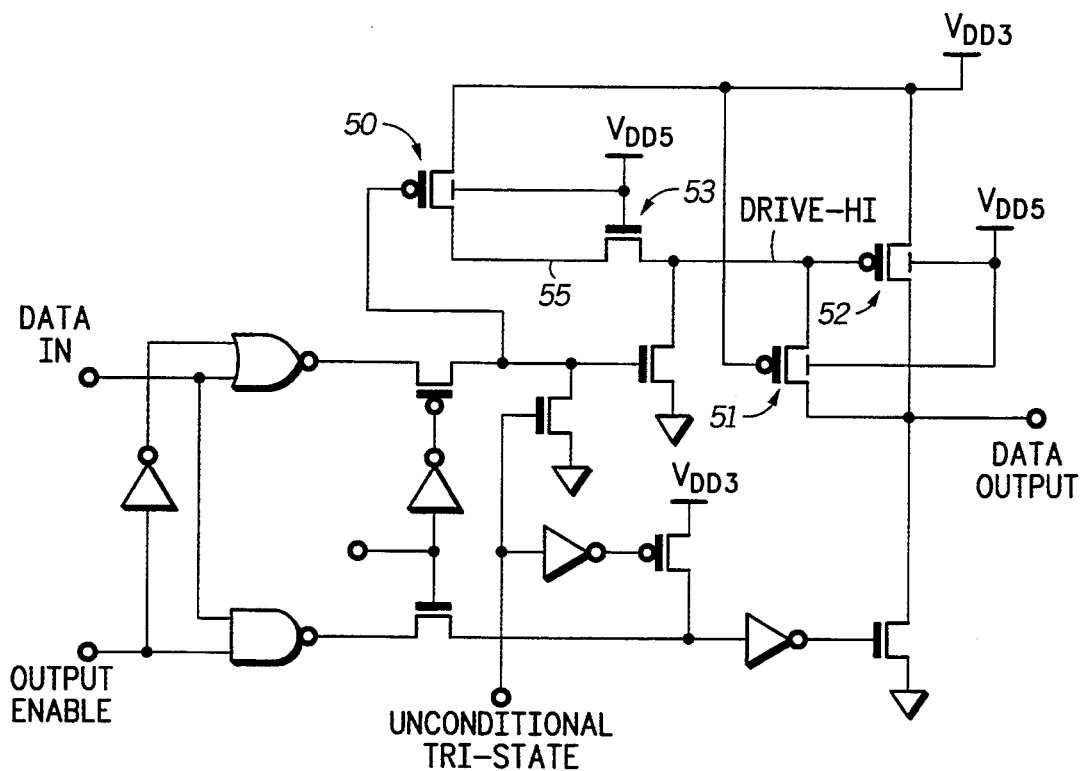
FIG. 3 illustrates in a circuit schematic another known output buffer circuit.

The driver of FIG. 5 avoids the problems in the circuit of FIG. 3. The driver of FIG. 5 does not require a dedicated pin for providing an n-well bias voltage. The driver has provisions for dealing with the situations where excessively high gate oxide voltages occur in various transistors of FIG. 3, thereby avoiding associated reliability problems. The driver of FIG. 5 has no leakage paths when the driver of FIG. 5 is in the high impedance state with the output voltage at 5 V. In general, the driver of FIG. 5 is superior to the driver of FIG. 3.

The driver of FIG. 5 avoids the problems in the driver of FIG. 4. The driver of FIG. 5 has no transistors whose gate is connected to the output node, avoiding various associated electro-static discharge (ESD) robustness problems. The driver of FIG. 5 has no limitations in turning off the pull-up transistor 154, thereby avoiding the associated crossover current problems discussed herein with regard to FIG. 4. The driver of FIG. 5 has provisions, discussed above, for dealing with the situation where excessively high gate oxide voltages occur in the circuit of FIG. 4, thereby avoiding various associated reliability problems.

Circuit portion 70 performs other advantageous functions in addition to those described above. When the driver of FIG. 5 is driving data onto the Data Output line, the voltage on Output Enable is 0 V and the voltage on Precondition is Vdd. The voltage on the gate of transistor 110 is Vdd, and the voltage on the gate of transistor 104 is 0 volts. Transistor 110 is on, and transistor 104 is off. Thus, the voltage on node A is 0 volts. Transistor 134 is on, allowing the Drive-Hi signal to be controlled by transistors 132 and 138.

If the next operation of the driver is to place the driver into tristate, the voltage on Output Enable falls from Vdd to 0 V, and the voltage on Output Enable rises from 0 V to Vdd. Transistor 112 turns off, and transistor 126 turns on. The common node that is the gate of transistors 132 and 138 discharges to 0 V, turning transistor 138 off and turning transistor 132 on. Since transistors 132 and 134 are on, the voltage on Drive-Hi rises all the way to Vdd, turning transistor 154 off and placing the driver in tristate. Simultaneously, NAND gate 101 drives the voltage on the gate of transistor 110 to 0 V, turning transistor 110 off. Inverter 102 drives the voltage on the gate of transistor 104 to Vdd, turning transistor 104 on. Because of the circuit implementation, Drive-Hi is fully deasserted before the voltage on node A begins to rise. The voltage on node A rises to (Vdd−|Vtn, body|) because of the body effect of transistors 104 and 106. Since |Vtn, body|>|Vtp|, transistor 134 is slightly on, allowing transistor 132 to maintain the voltage on Drive-Hi at Vdd. Transistor 154 remains off, and the driver remains in tristate.

As has been described above, when the driver is in tristate, and an external driver (not illustrated) drives the output above Vdd, the voltage on node A will rise above Vdd to the externally driven value. If the external driver then drives the output back down to Vdd, the voltage on node A will settle to (Vdd+|Vtp|). In this case, transistor 134 is off, preventing transistor 132 from driving the Drive-Hi signal to Vdd.

If charge begins to leak off of the Drive-Hi signal, and the voltage on that node begins to drop, circuit portion 75 prevents the voltage from falling so far as to turn on transistor 154 and violate the desired tristate condition. Since the voltage on Output Enable is Vdd and the voltage on Precondition is Vdd, the voltage on the gate of transistor 146 is 0 V, and transistor 146 is on. If the voltage on Drive-Hi falls below (Vdd−|Vtp|), transistor 148 will turn on. Charge will flow through transistors 146 and 148 onto the Drive-Hi node, raising its voltage back up to (Vdd−|Vtp|) and keeping transistor 154 off.

Figure 8:
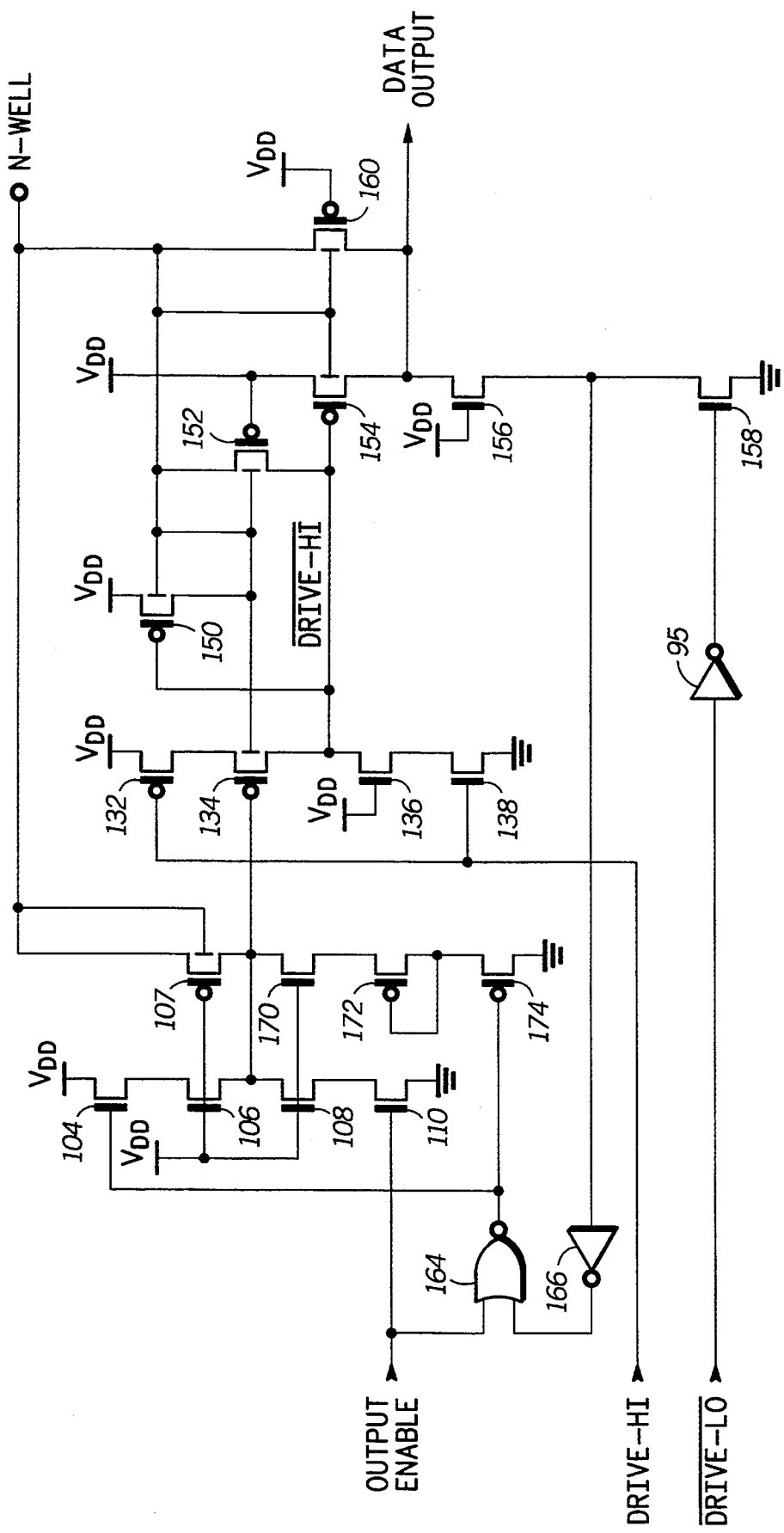
FIG. 8 illustrates in a circuit schematic another output buffer circuit in accordance with the present invention.

FIG. 8 illustrates an alternative output driver in accordance with the present invention. Many of the transistors in FIG. 8 are analogous to transistors in FIG. 5 and are therefore identically labeled. The transistors 104, 106, 107, 108, 110, 132, 134, 136, 138, 150, 152, 154, 156, 158, and 160 and circuit portion 95 are illustrated and discussed in reference to FIG. 5. The circuit of FIG. 8 adds three transistors 170, 172, and 174, a NOR gate 164, and an inverter 166 to the transistors illustrated in FIG. 5 and enumerated above. The transistor 170 has a first electrode coupled to the gate electrode of transistor 134, a second electrode, and a gate electrode coupled to Vdd. The transistor 172 has a first electrode coupled to the second electrode of transistor 170, a second electrode, and a gate electrode coupled to the second electrode of the transistor 172. The transistor 174 has a first electrode coupled to the second electrode of the transistor 172, a second electrode coupled to ground, and a gate electrode coupled to the gate electrode of transistor 104. NOR gate 164 has a first input connected to the Output Enable, a second input, and an output connected to the gate electrode of transistor 174. The inverter 166 has an input connected to the gate electrode of transistor 138 and an output connected to the second input of the NOR gate 164.

The operation of the driver of FIG. 8 is very similar to the operation of the driver of FIG. 5. Therefore, for the sake of brevity, the driver circuit of FIG. 8 is not fully discussed below. In general, the transistors 170, 172, and 174 function in a manner similar to the circuit portion 75 of FIG. 5. If the driver is in tristate and the gate voltage of transistor 134 has settled to (Vdd+|Vtp|) and the external driver (not illustrated) drives the Data Output to 0 V, the external driver will also drive the gate voltage of inverter 166 to 0 V through transistor 156. Inverter 166 drives its output to Vdd, and NOR gate 164 drives its output to 0 V. Transistor 104 turns off, and transistor 174 turns on, driving the gate voltage of transistor 134 to (|Vtp, body, transistor 174| + |Vtp, body, transistor 172|) because of the body effect of transistors 172 and 174. This voltage is less than (Vdd−|Vtp|), therefore transistor 134 turns on, allowing transistor 132 to maintain the voltage on Drive-Hi at Vdd. Transistor 154 remains off, and the driver remains in tristate. For a further understanding and explanation of the operation of the driver of FIG. 8, please see all the remarks made herein with regard to FIG. 5.

Figure 9:
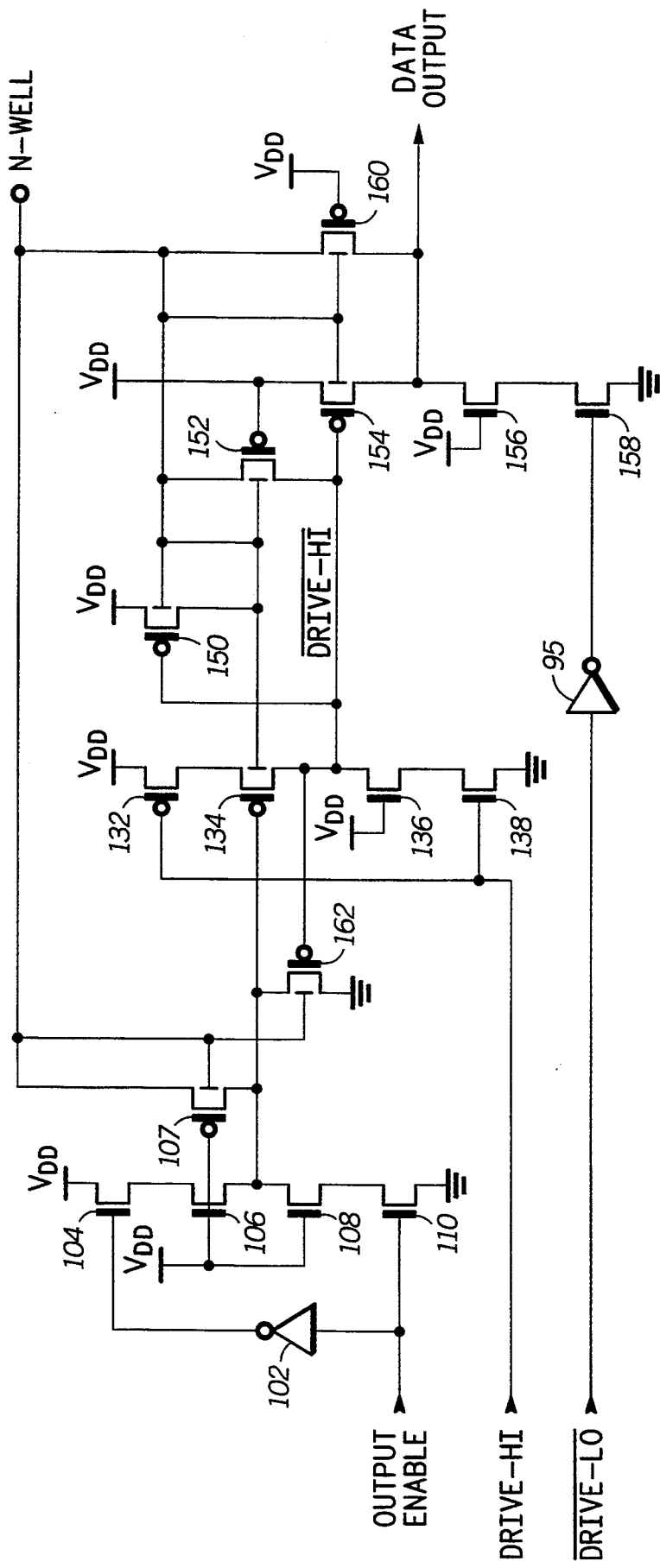
FIG. 9 illustrates in a circuit schematic yet another output buffer circuit in accordance with the present invention.

FIG. 9 illustrates yet another alternative output driver in accordance with the present invention. Many of the transistors in FIG. 9 are analogous to transistors in FIG. 5 and are therefore identically labeled. The transistors 104, 106, 107, 108, 110, 132, 134, 136, 138, 150, 152, 154, 156, 158, and 160 and circuit portion 95 (i.e., an inverter) are illustrated and discussed in reference to FIG. 5. The circuit of FIG. 9 adds a single transistor 162 to the design of FIG. 5. Transistor 162 has a first electrode connected to ground, a second electrode coupled to a gate electrode of transistor 134, a n-well contact coupled to the n-well, and a gate electrode coupled to Drive-Hi. The operation of the driver of FIG. 9 is very similar to the operation of the driver of FIG. 5. Therefore, for the sake of brevity, the driver circuit of FIG. 9 is not fully discussed below.

In general transistor 162 functions in a manner similar to circuit portion 75 of FIG. 5. If the driver is in tristate and the gate voltage of transistor 134 has settled to (Vdd+|Vtp|) and the voltage on Drive-Hi begins to drop below Vdd, transistor 162 turns on and begins discharging the gate of transistor 134. If the voltage on Drive-Hi continues to drop below (Vdd−|Vtp|), transistor 162 continues to drive the gate voltage on 134 lower until it reaches (Vdd−|Vtp|). Transistor 134 then turns on, allowing transistor 132 to maintain the voltage on Drive-Hi at Vdd. Transistor 154 remains off, and the driver remains in tristate. For further understanding and explanation of the operation of the driver of FIG. 9, please see all the remarks made herein with regard to FIG. 5.

Figure 10:
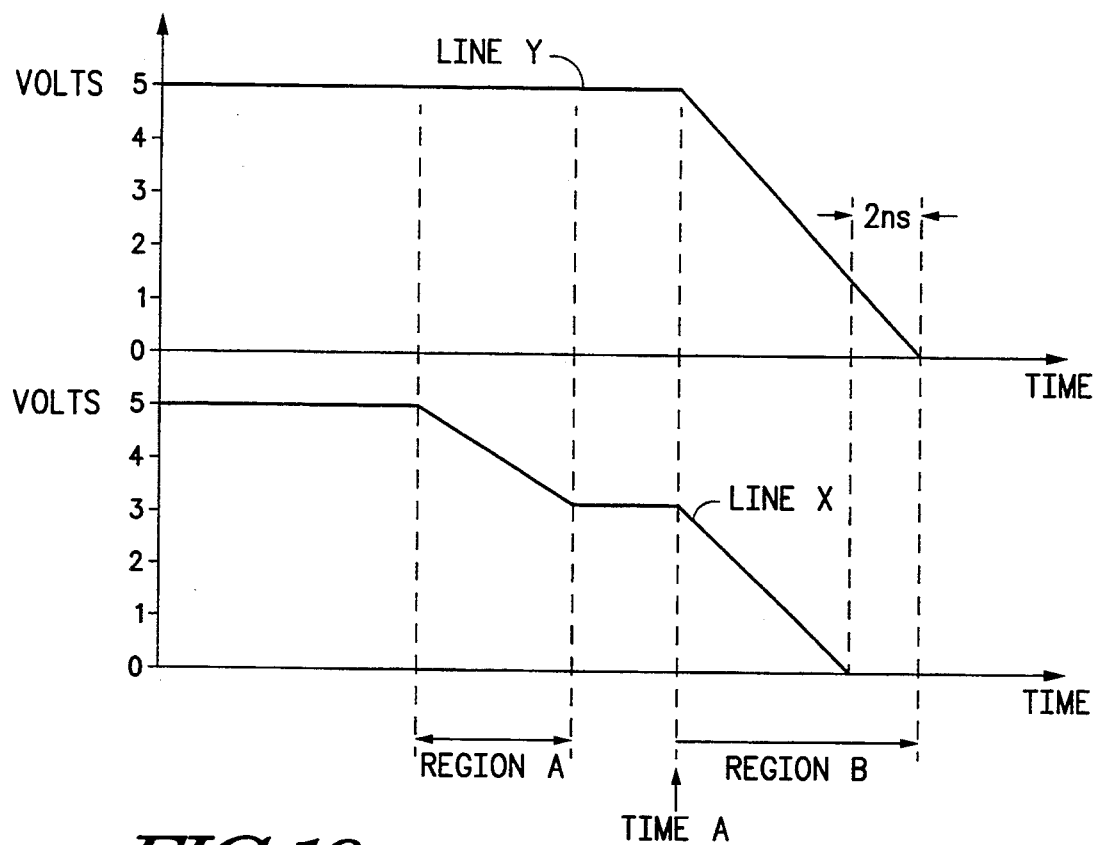
FIG. 10 illustrates in a graph how the signal Precondition functions in the circuit of FIG. 5.

FIG. 10 illustrates how the Precondition signal functions in the circuit of FIG. 5. Line Y indicates the Data Output for a circuit wherein no Precondition signal is used. The Line X indicates the voltage on the Data Output wherein the Precondition signal is used. For line Y, the Data Output is initially at 5 volts. At Time A in FIG. 10, the circuit of FIG. 5 (with no Precondition signal) is granted access to the Data Output (i.e., Output Enable is asserted). The circuit of FIG. 5 begins to output a logic zero onto the Data Output line. Region B indicates the time it takes to drive 5 volts to zero volts to indicate the logic zero on the Data Output line. Line X illustrates that the Precondition signal can be used to lower the Data Output voltage to 3.3 volts (still a logic high value) before the Output Enable is asserted at Time A. The driving of a logic zero onto the Data Output takes less time for Line X because 3.3 volts can be driven to 0 volts faster than 5 volts can be driven to 0 volts. Therefore, the Precondition signal reduces the drive-lo time of the circuit of FIG. 5 by roughly two nanoseconds (ns) as illustrated.

In general, the driver of FIG. 5 can be discussed in terms of circuit portions. For example, circuit portion 70 performs several functions within the output circuit of FIG. 5. Circuit portion 70 is responsible for activating and deactivating a control signal referred to as a Drive Hi in response to the Output Enable, the optional Precondition signal, and the Data Input signal. The circuit portion 70 drives the Drive Hi control signal to Vdd (3.3 volts) in response to the deactivation of the output enable. The circuit portion 70 turns off all conductive paths between the Drive Hi control signal and Vdd when the Data Output and/or the Drive Hi control signal rises above the Vdd (3.3 volts) supply voltage. The circuit portion 70 maintains the Drive Hi control signal at the Vdd voltage when the Output Enable is deactivated. The circuit portion 70 functions to discharge the Drive Hi control signal and the n-well voltage at a substantially equal rate to avoid high voltage potential across various p-channel transistors in FIG. 5. The voltage across the pull-up transistor gate oxide does not exceed roughly 4.1 volts under any operational bias condition, as illustrated in FIG. 6.

Circuit portion 75 functions to keep the Drive Hi control signal voltage to Vdd (3.3 volts) when the Output Enable signal is deactivated.

Circuit portion 80 functions to provide an output logic value to the Data Output conductor in FIG. 5. Specifically, circuit portion 80 drives a voltage of Vdd onto the Data Output conductor in response to activation of the Drive Hi control signal. In addition, the circuit portion 80 allows the voltage on the n-well in FIG. 5 to track a voltage on the Data Output conductor when the driver of FIG. 5 is in a high-impedance state and the Data Output conductor is driven to a voltage greater than Vdd (3.3 volts). Circuit portion 80 also allows the gate voltage of the transistor 154 to track the voltage on the n-well when the driver is in a high impedance (tri-state) mode and the Data Output conductor is driven to a voltage greater than Vdd. The circuit portion 80 functions to discharge a voltage on the n-well from a high externally-provided voltage (5.0 volts) in a manner which tracks the voltage of the Drive Hi control signal in order to reduce gate oxide stress. Gate oxide stress is reduced due to the fact that the gate oxide voltage is kept to below 4.1 volts as indicated in FIG. 6. Lower voltage differences result in reduced oxide stress.

Circuit portion 85 performs a complex logical function of the inputs Output Enable, the optional Precondition signal, and the Data Input signal in order to properly assert the Drive Hi control signal. If the optional Precondition signal is removed from FIG. 5 with all corresponding circuit elements, circuit portion 85 performs a NOR operation of the signals Output Enable and the Data Input.

Circuit portions 90 and 95 provide the function of generating a Drive-Lo control signal which is selectively asserted in order to drive a logic zero signal on the Data Output conductor. In general, circuit portion 90 in a NAND gate and circuit portion 95 is an inverter.

Circuit portion 100 is a pull-down circuit used for selectively driving the Data Output conductor to ground in response to the assertion of the Drive-Lo control signal. In circuit portion 100, the transistor 156 is used to reduce hot carrier injection (HCI) effects in the transistor 158. This HCI reduction circuit is used elsewhere in the circuit of FIG. 5.

Figure 11:
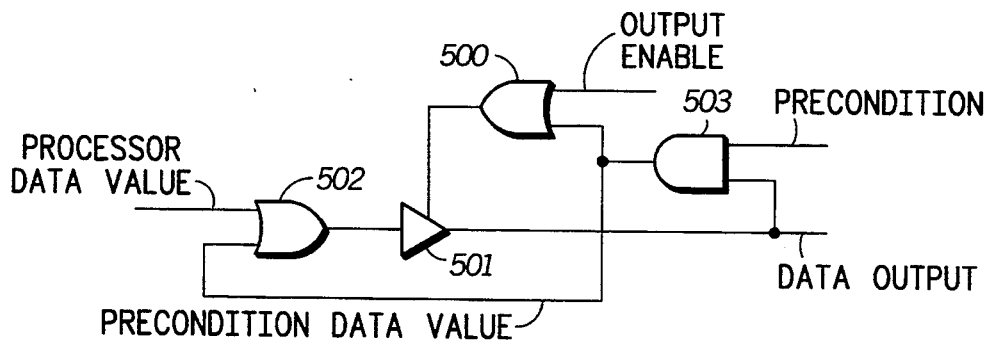
FIG. 11 illustrates, in a schematic diagram, a circuit which is used to precondition the Data Output of FIG. 5.

FIG. 11 illustrates a precondition circuit which is used to selectively drive the Data Output of FIG. 5 to 3.3 volts (or another voltage less than 5.0 volts) only when the Data Output is currently at a logic high. FIG. 11 illustrates a Precondition signal (active high), an Output Enable signal (active high), the Data Output of FIG. 5, a Processor Data Value (a logic one or zero data value which is the complementary Data Input signal of FIG. 5 when the circuit of FIG. 5 is functioning as an output buffer), and a Precondition data value. FIG. 11 illustrates that only a logic high on the Data Output is driven selectively to a lower voltage in response to an asserted Precondition signal.

FIG. 11 has an OR gate 500 which has a first input for receiving the Output Enable, a second input, and an output. A buffer 501 has a tri-state enable signal connected to the output of OR 500, an input, and an output which is the Data Output conductor. An AND gate 503 has a first input for receiving the Precondition signal, a second input for receiving the Data Output signal, and an output connected to the second input of the OR gate 500. An OR gate 502 has a first input connected to the internal Processor Data Value, a second input connected to the output of the AND gate 503, and an output connected to the input of the buffer 501.

Figure 12:
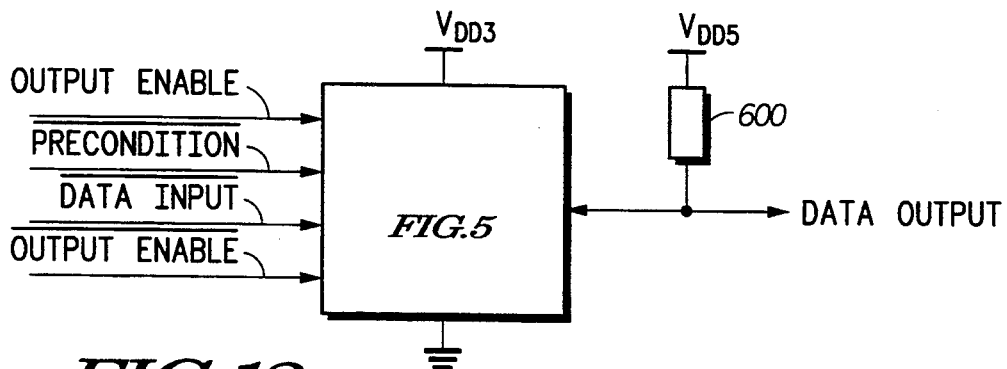
FIG. 12 illustrates, in a block diagram, a system in accordance with the present invention.

FIG. 12 illustrates that the circuit of FIG. 5 may not be active in an integrated circuit (IC) and "pulled-up" to a supply voltage. When an output buffer, input buffer, or input/output buffer is not used in an integrated circuit, it is not unlikely that the integrated circuit pin (i.e. Data Output) be coupled to a power supply voltage via a load device 600. The load device 600 may be a resistor, an active resistive device (i.e., transistor), or a like circuit component. It is also not unusual in multi-voltage systems that the circuit of FIG. 5 is powered by a Vdd3 power supply (i.e., 3.3 volts) and that the pull-up load device 600 is connected to a Vdd5 power supply (i.e., 5.0 volts). The circuit of FIG. 5 will handle the connections illustrated in FIG. 12 better than conventional output or output/input buffers due to the features discussed above. For example, no leakage current will result between Vdd5 and Vdd3 in FIG. 12 due to the circuit of FIG. 5, etc..

While the present invention has been illustrated and described with reference to specific embodiments, further modifications and improvements will occur to those skilled in the art. For example, specific transistors taught above may, in some cases, be replaced by either p-channel or n-channel MOS transistors, bipolar transistors, or other like switching devices. The circuits taught herein may be used to interface any integrated circuit having a first voltage to any integrated circuit having a higher second voltage. The substrate on which the above circuits are formed are not limited to silicon substrates, but may use any conventional semiconductor substrate material or structure. Non-inverting and inverting output buffers may be formed given the circuits illustrated herein. It is to be understood, therefore, that this invention is not limited to the particular forms illustrated and that it is intended in the appended claims to cover all modifications that do not depart from the spirit and scope of this invention.

I claim:

1. A first integrated circuit having a first output driver which is to interface with a second output driver located within a second integrated circuit, the first output driver being powered by a first voltage and the second output driver being capable of being powered by a second voltage wherein the first voltage is less than the second voltage, the first output driver comprising:
   a power supply voltage conductor for providing the first voltage;
   a data input conductor for providing a data input signal;
   an output enable conductor for providing an output enable signal;
   an well conductor used to bias at least one diffusion well having a first conductivity, the diffusion well containing at least one transistor connected for use within the first output driver;
   means for generating a control signal containing at least one transistor and having a first terminal coupled to the power supply voltage conductor, a second terminal coupled to the output enable conductor, a third terminal coupled to the well conductor, and a fourth terminal coupled to the data input conductor, the means for generating activating the control signal through a control conductor in response to both the data input signal and output enable signal, the means for generating driving the control conductor to the first voltage when deactivating the control signal, the means for generating turning off all conductive paths between the control conductor and the power supply voltage conductor when the control signal rises above the first voltage, the means for generating maintaining the control conductor at the first voltage when the output enable signal is deactivated, the means for generating discharging the control signal and a gate voltage on the at least one transistor in the diffusion well at a substantially equal rate to reduce gate oxide stress of the at least one transistor; and
   means for providing an output logic value onto the output conductor, the means for providing having a first terminal coupled to the output conductor, a second terminal for receiving the first voltage, a third terminal coupled to the well conductor, a fourth terminal coupled to the control conductor, and at least one pull-up transistor which couples the output conductor to the first voltage, the means for providing driving the first voltage on the output conductor in response to the activation of the control signal, the means for providing allowing a voltage on the well conductor to track a voltage on the output conductor when the first output driver is in a high-impedance state and the output conductor is driven to a voltage greater than the first voltage, the means for providing allowing a gate voltage of the at least one pull-up transistor to track a voltage on the well conductor when the driver is in a high-impedance state and the output conductor is driven to a voltage greater than the first voltage, the means for providing discharging a voltage on the well conductor from the second voltage in a manner which tracks the voltage of the control conductor in order to reduce gate oxide stress.

2. The first output driver of claim 1 further comprising:
   means coupled to the control conductor for ensuring that the control conductor remains at the first voltage when the output enable signal is deactivated.

3. The first output driver of claim 1 further comprising:
   a first transistor having a first current electrode, a second current electrode for receiving the first voltage, and a control electrode coupled to the output enable; and
   a second transistor having a first current electrode coupled to the first current electrode of the first transistor, a second current electrode coupled to the control conductor, and a control electrode coupled to the control conductor.

4. The first output driver of claim 1 further comprising:
   a transistor having a first current electrode coupled to the control conductor, a second current electrode for receiving the first voltage, and a control electrode coupled to the output enable.

5. The first output driver of claim 1 further comprising:
- a first transistor having a first current electrode, a second current electrode for receiving the first voltage, and a control electrode;
- a NAND gate having a first input for receiving an inverted output enable signal, a second input for receiving an inverted precondition signal which selectively drives the control conductor to a voltage which is less than the second voltage, and an output which is coupled to the control electrode of the first transistor; and
- a second transistor having a first current electrode coupled to the first current electrode of the first transistor, a second current electrode coupled to the control conductor, and a control electrode coupled to the control conductor.

6. The first output driver of claim 1 further comprising:
- a precondition signal coupled to the control conductor through a transistor, the precondition signal driving the control conductor to a voltage which is lower in voltage potential than the second voltage when the precondition signal is activated.

7. The first output driver of claim 1 wherein the means for providing further comprises:
- a transistor having a substrate terminal coupled to the well conductor, a first current electrode for receiving the first voltage, a second current electrode coupled to the output conductor, and a control electrode coupled to the control conductor.

8. The first output driver of claim 1 wherein the means for providing further comprises:
- a first transistor having a substrate terminal coupled to the well conductor, a first current electrode for receiving the first voltage, a second current electrode coupled to the output conductor, and a control electrode coupled to the control conductor; and
- a second transistor having a substrate terminal coupled to the well conductor, a first current electrode coupled to the well conductor, a second current electrode coupled to the control electrode of the first transistor, and a control electrode for receiving the first voltage.

9. The first output driver of claim 1 wherein the means for providing further comprises:
- a first transistor having a substrate terminal coupled to the well conductor, a first current electrode for receiving the first voltage, a second current electrode coupled to the output conductor, and a control electrode coupled to the control conductor;
- a second transistor having a substrate terminal coupled to the well conductor, a first current electrode coupled to the well conductor, a second current electrode coupled to the control electrode of the first transistor, and a control electrode for receiving the first voltage; and
- a third transistor having a substrate terminal coupled to the well conductor, a first current electrode coupled to the well conductor, a second current electrode for receiving the first voltage, and a control electrode coupled to the control conductor.

10. The first output driver of claim 1 wherein the means for providing further comprises:
- a first transistor having a substrate terminal coupled to the well conductor, a first current electrode for receiving the first voltage, a second current electrode coupled to the output conductor, and a control electrode coupled to the control conductor;
- a second transistor having a substrate terminal coupled to the well conductor, a first current electrode coupled to the well conductor, a second current electrode coupled to the control electrode of the first transistor, and a control electrode for receiving the first voltage;
- a third transistor having a substrate terminal coupled to the well conductor, a first current electrode coupled to the well conductor, a second current electrode for receiving the first voltage, and a control electrode coupled to the control conductor; and
- a fourth transistor having a substrate terminal connected to the well conductor, a first current electrode connected to the output conductor, a second current electrode connected to the well conductor, and a control electrode for receiving the first voltage.

11. The first output driver of claim 1 wherein the means for providing allows a voltage on the well conductor to track a voltage on the output conductor when the first output driver is in a high-impedance state and the output conductor is driven to a voltage greater than the first voltage.

12. The first output driver of claim 1 wherein the means for providing allows a gate voltage of the at least one pull-up transistor to track a voltage on the well conductor when the driver is in a high-impedance state and the output conductor is driven to a voltage greater than the first voltage.

13. The first output driver of claim 1 wherein the first voltage is substantially equal to 3.3 volts.

14. The first output driver of claim 1 wherein the first voltage is less than five volts.

15. The first output driver of claim 1 wherein the output logic value is a logic value which represents a logic one.

16. The output circuit driver of claim 1 wherein the at least one transistor in the means for generating comprises:
- a transistor of a first conductivity type having a first current electrode coupled to the well conductor, a second current electrode, a substrate terminal coupled to the well conductor, and a control electrode for receiving the first voltage; and
- a transistor of a second conductivity type having a first current electrode coupled to the second current electrode of the transistor of the first conductivity type, a second current electrode coupled to a ground potential, and a control electrode for receiving the first voltage.

17. The output circuit driver of claim 1 wherein the means for generating further comprises:
- a transistor of a first conductivity type having a first current electrode coupled to the well conductor, a second current electrode, a substrate terminal coupled to the well conductor, and a control electrode for receiving the first voltage; and
- an transistor of a second conductivity type having a first current electrode coupled to the second current electrode of the transistor of the first conductivity type, a second current electrode coupled to a ground potential, and a control electrode coupled to the output enable conductor.

18. The output circuit driver of claim 1 wherein the means for generating further comprises:
   a first transistor having a first current electrode for receiving the first voltage, a second current electrode, and a control electrode coupled to the output enable conductor;
   a second transistor having a first current electrode coupled to the second current electrode of the first transistor, a second current electrode, and a control electrode for receiving the first voltage;
   a third transistor having a first current electrode coupled to the second current electrode of the second transistor, a second current electrode, and a control electrode for receiving the first voltage; and
   a fourth transistor having a first current electrode coupled to the second current electrode of the third transistor, a second current electrode for receiving a ground potential, and a control electrode coupled to the output enable conductor.

19. The output circuit driver of claim 1 wherein the means for generating further comprises:
   a first p-channel transistor having a first current electrode for receiving the first voltage, a second current electrode, and a control electrode coupled to the output enable conductor;
   a second p-channel transistor having a first current electrode coupled to the second current electrode of the first p-channel transistor, a second current electrode, a substrate terminal coupled to the n-well conductor, and a control electrode for receiving a drive-hi control signal which is activated in response to the data input signal and the output enable signal;
   a first n-channel transistor having a first current electrode coupled to the second current electrode of the second p-channel transistor, a second current electrode, and a control electrode for receiving the first voltage; and
   a second n-channel transistor having a first current electrode coupled to the second current electrode of the first n-channel transistor, a second current electrode for receiving a ground potential, and a control electrode coupled to the output enable conductor.

20. The output circuit driver of claim 1 wherein the output driver functions as an output driver selected from a group consisting of: an input/output driver and an output driver.

21. The output circuit driver of claim 1 further comprising:
   an n-channel pull-down transistor having a first current electrode coupled to the output conductor, a second current electrode coupled to a ground potential, and a control electrode for receiving a drive-lo control signal in response to the data input signal and the output enable signal.

22. A first integrated circuit having an first output driver which is to interface with a second output driver located within a second integrated circuit, the first output driver being powered by a first voltage and the second output driver being powered by a second voltage wherein the first voltage is less than the second voltage, the first output driver comprising:
   a power supply voltage conductor for providing the first voltage;
   a data input conductor for providing a data input signal;
   an output enable conductor for providing an output enable signal;
   a well conductor used to bias at least one diffusion well containing at least one transistor within the first output driver;
   means for generating a control signal containing at least one transistor and having a first terminal coupled to the power supply voltage conductor, a second terminal coupled to the output enable conductor, a third terminal coupled to the well conductor, and a fourth terminal coupled to the data input conductor, the means for generating driving a control signal conductor to the first voltage response to the deactivation of the control signal, the means for generating discharging the control signal and a gate voltage on the at least one transistor at a substantially equal rate to reduce gate oxide stress; and
   means for providing an output logic value onto a output conductor, the means for providing having a first terminal coupled to the output conductor, a second terminal for receiving the first voltage through at least one pull-up transistor, a third terminal coupled to the well conductor, and a fourth terminal coupled to the control signal conductor, the means for providing discharging a voltage on the well conductor from the second voltage in a manner which tracks the voltage of the control signal conductor to reduce electric field stress across a gate oxide of the pull-up transistor.

23. The first output driver of claim 22 further comprising:
   means for ensuring that the control signal conductor remains at the first voltage when the output enable signal is deactivated.

24. The first output driver of claim 22 further comprising:
   a first transistor having a first current electrode, a second current electrode for receiving the first voltage, and a control electrode coupled to the output enable; and
   a second transistor having a first current electrode coupled to the first current electrode of the first transistor, a second current electrode coupled to the control signal conductor, and a control electrode coupled to the control signal conductor.

25. The first output driver of claim 22 further comprising:
   a transistor having a first current electrode coupled to the control signal conductor, a second current electrode for receiving the first voltage, and a control electrode coupled to the output enable.

26. The first output driver of claim 22 further comprising:
   a first transistor having a first current electrode, a second current electrode for receiving the first voltage, and a control electrode;
   a NAND gate having a first input for receiving an output enable signal, a second input for receiving a precondition control signal which selectively drives the control signal conductor to a voltage having a potential which is less than the second voltage, and an output which is coupled to the control electrode of the first transistor; and
   a second transistor having a first current electrode coupled to the first current electrode of the first transistor, a second current electrode coupled to the control signal conductor, and a control electrode coupled to the control signal conductor.

27. The first output driver of claim 22 further comprising:
a precondition control signal coupled to the control signal conductor through a transistor, the precondition control signal driving the control signal conductor to a voltage having a potential which is less than the second voltage when the precondition control signal is activated.

28. The first output driver of claim 22 wherein the means for providing further comprises:
a transistor having a substrate terminal coupled to the well conductor, a first current electrode for receiving the first voltage, a second current electrode coupled to the output conductor, and a control electrode coupled to the control signal conductor.

29. The first output driver of claim 22 wherein the means for providing further comprises:
a first transistor having a substrate terminal coupled to the well conductor, a first current electrode for receiving the first voltage, a second current electrode coupled to the output conductor, and a control electrode coupled to the control signal conductor; and
a second transistor having a substrate terminal coupled to the well conductor, a first current electrode coupled to the well conductor, a second current electrode coupled to the control electrode of the first transistor, and a control electrode for receiving the first voltage.

30. The first output driver of claim 22 wherein the means for providing further comprises:
a first transistor having a substrate terminal coupled to the well conductor, a first current electrode for receiving the first voltage, a second current electrode coupled to the output conductor, and a control electrode coupled to the control signal conductor;
a second transistor having a substrate terminal coupled to the well conductor, a first current electrode coupled to the well conductor, a second current electrode coupled to the control electrode of the first transistor, and a control electrode for receiving the first voltage; and
a third transistor having a substrate terminal coupled to the well conductor, a first current electrode coupled to the well conductor, a second current electrode for receiving the first voltage, and a control electrode coupled to the control signal conductor.

31. The first output driver of claim 22 wherein the means for providing further comprises:
a first transistor having a substrate terminal coupled to the well conductor, a first current electrode for receiving the first voltage, a second current electrode coupled to the output conductor, and a control electrode coupled to the control signal conductor;
a second transistor having a substrate terminal coupled to the well conductor, a first current electrode coupled to the well conductor, a second current electrode coupled to the control electrode of the first transistor, and a control electrode for receiving the first voltage;
a third transistor having a substrate terminal coupled to the well conductor, a first current electrode coupled to the well conductor, a second current electrode for receiving the first voltage, and a control electrode coupled to the control signal conductor; and
a fourth transistor having a substrate terminal connected to the well conductor, a first current electrode connected to the output conductor, a second current electrode connected to the well conductor, and a control electrode for receiving the first voltage.

32. The output circuit driver of claim 22 wherein the means for generating further comprises:
a transistor of a first conductivity type having a first current electrode coupled to the well conductor, a second current electrode, a substrate terminal coupled to the well conductor, and a control electrode for receiving the first voltage; and
an transistor of a second conductivity type having a first current electrode coupled to the second current electrode of the transistor of the first conductivity type, a second current electrode coupled to a ground potential, and a control electrode for receiving the first voltage.

33. The output circuit driver of claim 22 wherein the means for generating further comprises:
a transistor of a first conductivity type having a first current electrode coupled to the well conductor, a second current electrode, a substrate terminal coupled to the well conductor, and a control electrode for receiving the first voltage; and
a transistor of a second conductivity type having a first current electrode coupled to the second current electrode of the transistor of the first conductivity type, a second current electrode coupled to a ground potential, and a control electrode coupled to the output enable conductor.

34. The output circuit driver of claim 22 wherein the means for generating further comprises:
a first transistor having a first current electrode for receiving the first voltage, a second current electrode, and a control electrode coupled to the output enable conductor;
a second transistor having a first current electrode coupled to the second current electrode of the first transistor, a second current electrode, and a control electrode for receiving the first voltage; a third transistor having a first current electrode coupled to the second current electrode of the second transistor, a second current electrode, and a control electrode for receiving the first voltage; and
a fourth transistor having a first current electrode coupled to the second current electrode of the third transistor, a second current electrode for receiving a ground potential, and a control electrode coupled to the output enable conductor.

35. The output circuit driver of claim 22 wherein the means for generating further comprises:
a first p-channel transistor having a first current electrode for receiving the first voltage, a second current electrode, and a control electrode coupled to the output enable conductor;
a second p-channel transistor having a first current electrode coupled to the second current electrode of the first p-channel transistor, a second current electrode, a substrate terminal coupled to the well conductor, and a control electrode coupled to the output enable conductor;

a first n-channel transistor having a first current electrode coupled to the second current electrode of the second p-channel transistor, a second current electrode, and a control electrode for receiving the first voltage; and a second n-channel transistor having a first current electrode coupled to the second current electrode of the first n-channel transistor, a second current electrode for receiving a ground potential, and a control electrode coupled to the output enable conductor.

36. The output circuit driver of claim 22 further comprising:

a pull-down transistor having a first current electrode coupled to the output conductor, a second current electrode coupled to a ground potential, and a control electrode for receiving a drive-lo control signal in response to the data input signal and the output enable signal.

37. An output circuit comprising:

a first transistor having a control electrode for receiving a control signal, a first current electrode for receiving a supply voltage, a channel region coupled to a channel conductor which is used to bias the channel region, and a second current electrode electrically coupled to the channel conductor;

a second transistor having a control electrode for receiving the supply voltage, a first current electrode coupled to the channel conductor, a channel region coupled to the channel conductor, and a second current electrode electrically coupled to the control signal;

a third transistor having a control electrode for receiving the control signal, a first current electrode for receiving the supply voltage, a channel region coupled to the channel conductor, and a second current electrode electrically coupled to an output; and a fourth transistor having a control electrode for receiving the supply voltage, a first current electrode coupled to the channel conductor, a channel region coupled to the channel conductor, and a second current electrode electrically coupled to the output.

38. The output circuit of claim 37 further comprising:
means for ensuring that the control signal remains at the first voltage when the output enable signal is deactivated, the means for ensuring being coupled to the control signal.

39. The output circuit of claim 37 further comprising:
means for generating the control signal containing at least one transistor and having a first terminal for receiving the power supple voltage, a second terminal coupled to an output enable conductor, a third terminal coupled to the channel conductor, and a fourth terminal coupled to a data input conductor, the means for generating driving the control signal to the first voltage in response to the deactivation of the control signal, the means for generating discharging the control signal and a gate voltage on the at least one transistor at a substantially equal rate to reduce gate oxide stress.

40. The output circuit of claim 37 wherein the output circuit is used to selectively drive the output to a voltage substantially equal to the supply voltage in order to transmit a logic one through the output.

41. The output circuit of claim 37 wherein the first, second, third, and fourth transistors are formed as p-channel transistors.

42. The output circuit of claim 37 wherein the first, second, third, and fourth transistors are all formed within a same n-well diffusion region within a substrate material.

43. The output circuit of claim 37 wherein the output circuit drives the supply voltage on the output in response to the activation of the control signal.

44. The output circuit of claim 37 wherein the output circuit allows a voltage on the channel conductor to track a voltage on the output when the output circuit is in a high-impedance state and the output is driven to a voltage greater than the supply voltage.

45. The output circuit of claim 37 wherein the output circuit allows at least one gate voltage of the transistors within the output circuit to track a voltage on the channel conductor when the driver is in a high-impedance state and the output is driven to a voltage greater than the supply voltage.

46. The output circuit of claim 37 wherein the output circuit discharges a voltage on the channel conductor down from a voltage greater than the supply voltage in a manner which tracks the voltage of the channel conductor to reduce electric field strength across a gate oxide of one of the transistors in the output circuit.

47. A circuit for providing a control signal within an output buffer, the circuit comprising:

a first n-channel transistor having a first current electrode for receiving a power supply voltage, a second current electrode, and a control electrode coupled to an inverted output enable;

a second n-channel transistor having a first current electrode coupled to the second current electrode of the first n-channel transistor, a second current electrode, and a control electrode for receiving the power supply voltage;

a third n-channel transistor having a first current electrode coupled to the second current electrode of the second n-channel transistor, a second current electrode, and a control electrode for receiving the power supply voltage;

a fourth n-channel transistor having a first current electrode coupled to the second current electrode of the third n-channel transistor, a second current electrode for receiving a ground potential, and a control electrode coupled to an output enable; and a first p-channel transistor having a channel region formed in an n-well wherein the n-well is connected to a conductor which affects the bias of the channel region, a first current electrode coupled to the channel region, a second current electrode coupled to the second current electrode of the second n-channel transistor, and a control electrode for receiving the power supply voltage.

48. The circuit of claim 47 further comprising:

a second p-channel transistor having a first current electrode for receiving the power supply voltage, a second current electrode, and a control electrode coupled selectively, via a plurality of p-channel connection transistors, to the power supply voltage;

a third p-channel transistor having a first current electrode coupled to the second current electrode of the second p-channel transistor, a second current electrode, and a control electrode coupled to the second current electrode of the first p-channel transistor; and a fifth n-channel transistor having a first current electrode coupled to the second current electrode of the third p-channel transistor, a second current electrode coupled to the ground potential, and a control electrode coupled selectively, via the plurality of p-channel connection transistors, to the power supply voltage.

49. The circuit of claim 47 further comprising:
circuitry for ensuring that the second current electrode of the third p-channel transistor remains at the power supply voltage when the output enable signal is deactivated, the circuitry for ensuring being coupled to the second current electrode of the third transistor.

50. The circuit of claim 47 further comprising:
circuitry for providing an output logic value onto a output conductor, the circuitry for providing having a first terminal coupled to an output conductor, a second terminal for receiving the power supply voltage, a third terminal coupled to the n-well, a fourth terminal coupled to the second current electrode of the third transistor, and at least one pull-up transistor which couples the output conductor the power supply voltage, the circuitry for providing discharging a voltage on the n-well from a voltage greater than the power supply voltage in a manner which tracks the voltage of the second current electrode of the second n-channel transistor to reduce electric field stress across a gate oxide of the third transistor.

51. An output buffer circuit comprising:
a first n-channel transistor having a first current electrode for receiving a power supply voltage, a second current electrode, and a control electrode coupled to an output enable;
a second n-channel transistor having a first current electrode coupled to the second current electrode of the first n-channel transistor, a second current electrode, and a control electrode for receiving the power supply voltage;
a third n-channel transistor having a first current electrode coupled to the second current electrode of the second n-channel transistor, a second current electrode, and a control electrode for receiving the power supply voltage;
a fourth n-channel transistor having a first current electrode coupled to the second current electrode of the third n-channel transistor, a second current electrode for receiving a ground potential, and a control electrode coupled to the output enable;
a first p-channel transistor having a channel region formed in an n-well wherein the n-well is connected to a conductor which affects the bias of the channel region, a first current electrode coupled to the channel region, a second current electrode coupled to the second current electrode of the second n-channel transistor, and a control electrode for receiving the power supply voltage;
a second p-channel transistor having a first current electrode for receiving the power supply voltage, a second current electrode, and a control electrode coupled to the output enable;
a third p-channel transistor having a first current electrode coupled to the second current electrode of the second p-channel transistor, a second current electrode, and a control electrode coupled the second current electrode of the first p-channel transistor;

a fifth n-channel transistor having a first current electrode coupled to the second current electrode of the third p-channel transistor, a second current electrode coupled to the ground potential, and a control electrode coupled to the output enable;
a fourth p-channel transistor having a control electrode coupled to the second current electrode of the third p-channel transistor, a first current electrode for receiving a supply voltage, a channel region coupled to the conductor which affects the bias of the channel region, and a second current electrode electrically coupled to the conductor which affects the bias of the channel region;
a fifth p-channel transistor having a control electrode for receiving the power supply voltage, a first current electrode coupled to the conductor which affects the bias of the channel region, a channel region coupled to the conductor which affects the bias of the channel region, and a second current electrode electrically coupled to the second current electrode of the third p-channel transistor;
a sixth p-channel transistor having a control electrode coupled to the second current electrode of the third p-channel transistor, a first current electrode for receiving the power supply voltage, a channel region coupled to the conductor which affects the bias of the channel region, and a second current electrode electrically coupled to the conductor which affects the bias of the channel region; and
a seventh p-channel transistor having a control electrode for receiving the power supply voltage, a first current electrode coupled to the conductor which affects the bias of the channel region, a channel region coupled to the conductor which affects the bias of the channel region, and a second current electrode electrically coupled to the output.

52. The circuit of claim 51 further comprising:
circuitry for ensuring that the second current electrode of the third transistor remains at the power supply voltage when the output enable is deactivated, the circuitry for ensuring being coupled to the second current electrode of the third transistor.

53. An output buffer circuit comprising:
an output;
a drive-hi control signal for substantially driving the output to a logic high value;
a plurality of p-channel transistors wherein a first p-channel transistor is coupled to a second p-channel transistor, the second p-channel transistor is coupled to a third p-channel transistor, and the third p-channel transistor is coupled to a fourth p-channel transistor, the plurality of p-channel transistors being coupled for selectively providing the logic high value to the output in response to the drive-hi control signal, the first p-channel transistor being coupled to a supply voltage, the second p-channel transistor being connected in series directly between the well conductor and the drive-hi signal the plurality of p-channel transistors being capable of receiving a voltage greater than the supply voltage from the output without adverse leakage current resulting from the output to the supply voltage, the plurality of p-channel transistors having a gate to channel voltage which does not exceed 4.1 volts; and circuitry, coupled to the output, for selectively providing a logic low value to the output.

54. The output buffer of claim 53 wherein the plurality of p-channel transistors comprises:
a p-channel transistor having a control electrode coupled to a control signal, a first current electrode for receiving a supply voltage, a channel region coupled to a conductor which affects the bias of the channel region, and a second current electrode electrically coupled to the conductor which affects the bias of the channel region.

55. A first output driver powered with a voltage within a range of 2.0 volts to 3.6 volts for communicating with an external second output driver powered with a voltage greater than 3.0 volts, the first output driver comprising:
a p-channel pull-up transistor having a first current electrode connected to a power supply voltage, a second current electrode coupled to a data output line, an n-well conductor which allows the voltage of a channel region of the pull-up transistor to be altered, and a control electrode for receiving a drive-hi control signal;
a single series p-channel transistor having a first current electrode coupled to the n-well conductor, a second current electrode coupled to the drive-hi signal, a control electrode coupled to the power supply voltage, and a channel region coupled to the n-well conductor;
circuitry for maintaining a voltage difference coupled between the channel region of the, pull-up transistor and the control electrode of the pull-up transistor, the circuitry for maintaining keeping the voltage difference between the channel region of the pull-up transistor and the control electrode of the pull-up transistor within the range of zero volts to 4.1 volts, in absolute value, regardless of a voltage on the data output line coupled to the p-channel pull-up transistor.

56. The first output driver of claim 55 further comprising:
a n-channel pull-down transistor having a first current electrode coupled to the data output line, a second current electrode coupled to a ground potential, and a control electrode for receiving a drive-lo control signal which is complementary to the drive-hi signal.

57. An output driver comprising:
a p-channel pull-up transistor having a first current electrode connected to a power supply voltage, a second current electrode coupled to a data output line, a n-well conductor which allows the voltage of a channel region of the pull-up transistor to be altered, and a control electrode for receiving a first control signal;
an n-channel pull-down transistor having a first current electrode connected to a ground potential, a second current electrode coupled to the data output line, and a control electrode for receiving a second control signal; and
a single p-channel transistor having a first current electrode coupled to the n-well conductor, a second current electrode coupled to the first control signal, a channel region coupled to the n-well conductor, and a control electrode for receiving the power supply voltage, the single p-channel transistor selectively coupling the n-well conductor to the first control signal.

58. A method for driving a data value onto a conductor, the method comprising the steps of:
having the conductor at a first voltage;
determining that the data value is to be driven onto the conductor;
lowering the voltage of the conductor from the first voltage to a second voltage wherein the second voltage is less than the first voltage, the lowering being performed in response to a control signal and being performed before the data value is driven on the conductor; and
driving the data value onto the conductor.

59. The method of claim 58 wherein the control signal is a precondition control signal which is asserted before the assertion of an output enable wherein the output enable allows the data value to be driven through the conductor.

60. A system for providing a data value through a conductor, the system having an output enable control signal and comprising:
a first transistor for providing a first power supply voltage to the conductor;
a second transistor for providing a second power supply voltage to the conductor wherein the second voltage is different from the first voltage; and
a precondition control signal coupled to the first transistor for driving the conductor from a third voltage to the second voltage wherein the second voltage is less than the third voltage, the third voltage being driven to the second voltage in preparation for the assertion of the output enable control signal.

61. The method of claim 58 wherein the data value is a logic zero value and step of driving comprises:
driving the conductor from the second voltage down to a logic zero value.

* * * * *

UNITED STATES PATENT AND TRADEMARK OFFICE
CERTIFICATE OF CORRECTION

PATENT NO. : 5,396,128
DATED : March 7, 1995
INVENTOR(S) : James E. Dunning et al It is certified that error appears in the above-identified patent and that said Letters Patent is hereby corrected as shown below:

Col. 30, line 44:  Change "to" to -- towards --

Col. 30, line 46:  Change "to" to -- towards --

Signed and Sealed this

Twenty-second Day of August, 1995

Attest:

BRUCE LEHMAN

Attesting Officer  Commissioner of Patents and Trademarks